(12) United States Patent
Van Hoogdalem et al.

(10) Patent No.: US 12,171,148 B2
(45) Date of Patent: *Dec. 17, 2024

(54) FABRICATION METHODS

(71) Applicant: Microsoft Technology Licensing, LLC, Redmond, WA (US)

(72) Inventors: Kevin Van Hoogdalem, Zoetermeer (NL); Leonardus Kouwenhoven, The Hague (NL); Pavel Aseev, The Hague (NL); Peter Krogstrup Jeppesen, Copenhagen (DK)

(73) Assignee: Microsoft Technology Licensing, LLC, Redmond, WA (US)

( * ) Notice: Subject to any disclaimer, the term of this patent is extended or adjusted under 35 U.S.C. 154(b) by 88 days.

This patent is subject to a terminal disclaimer.

(21) Appl. No.: 17/382,174

(22) Filed: Jul. 21, 2021

(65) Prior Publication Data

US 2022/0102425 A1 Mar. 31, 2022

Related U.S. Application Data

(62) Division of application No. 16/484,088, filed as application No. PCT/US2018/057841 on Oct. 26, 2018, now Pat. No. 11,296,145.

(30) Foreign Application Priority Data

Nov. 15, 2017 (GB) ....................................... 1718897
Nov. 30, 2017 (WO) ................. PCT/EP2017/081038

(51) Int. Cl.
*H10N 69/00* (2023.01)
*C23C 14/28* (2006.01)
(Continued)

(52) U.S. Cl.
CPC .............. *H10N 69/00* (2023.02); *C23C 14/28* (2013.01); *C30B 11/12* (2013.01); *C30B 23/06* (2013.01);
(Continued)

(58) Field of Classification Search
CPC .. H10N 69/00; H10N 60/01; H10N 60/09802; H10N 60/0884; H10N 60/10;
(Continued)

(56) References Cited

U.S. PATENT DOCUMENTS 4,145,699 A  3/1979  Hu et al.
4,454,522 A  6/1984  De
(Continued)

FOREIGN PATENT DOCUMENTS

CN  1253311 A  5/2000
CN  104769732 A  7/2015
(Continued)

OTHER PUBLICATIONS

Gazibegovic et al., "Epitaxy of Advanced Nanowire Quantum Devices," *Journal of Nature*, vol. 548, Issue 7668, 35 pages (Aug. 24, 2017).
(Continued)

*Primary Examiner* — Brian K Talbot
(74) *Attorney, Agent, or Firm* — Klarquist Sparkman, LLP

(57) ABSTRACT

Various fabrication methods are disclosed. In one such method, at least one structure is formed on a substrate which protrudes outwardly from a plane of the substrate. A beam is used to form a layer of material, at least part of which is in direct contact with a semiconductor structure on the substrate, the semiconductor structure comprising at least one nanowire. The beam has a non-zero angle of incidence relative to the normal of the plane of the substrate such that
(Continued)

the beam is incident on one side of the protruding structure, thereby preventing a portion of the nanowire in a shadow region adjacent the other side of the protruding structure in the plane of the substrate from being covered with the material.

19 Claims, 20 Drawing Sheets

(51) Int. Cl.
    | | |
    |---|---|
    | *C30B 11/12* | (2006.01) |
    | *C30B 23/06* | (2006.01) |
    | *H01L 29/06* | (2006.01) |
    | *H10N 60/01* | (2023.01) |
    | *H10N 60/10* | (2023.01) |
    | *H10N 60/82* | (2023.01) |
    | *B82Y 10/00* | (2011.01) |
    | *G06N 10/00* | (2022.01) |

(52) U.S. Cl.
    CPC ......... *H01L 29/0669* (2013.01); *H10N 60/01* (2023.02); *H10N 60/0801* (2023.02); *H10N 60/0884* (2023.02); *H10N 60/10* (2023.02); *H10N 60/82* (2023.02); *B82Y 10/00* (2013.01); *G06N 10/00* (2019.01)

(58) Field of Classification Search
    CPC ......... H10N 60/82; C23C 14/28; C30B 11/12; C30B 23/06; G06N 10/00; B82Y 10/00
    USPC .......................................................... 427/62
    See application file for complete search history.

(56) References Cited

U.S. PATENT DOCUMENTS

| | | | | |
|---|---|---|---|---|
| 4,529,686 | A * | 7/1985 | Kraus | H01L 21/033 |
| | | | | 438/947 |
| 5,294,869 | A * | 3/1994 | Tang | H10K 59/173 |
| | | | | 428/917 |
| 5,366,849 | A * | 11/1994 | Nakagawa | G03F 7/201 |
| | | | | 430/314 |
| 6,194,268 | B1 * | 2/2001 | Furukawa | H01L 21/31144 |
| | | | | 438/944 |
| 6,440,637 | B1 | 8/2002 | Choi et al. | |
| 6,517,996 | B1 * | 2/2003 | Chao | H10K 59/122 |
| | | | | 430/315 |
| 9,873,937 | B2 * | 1/2018 | Lee | C23C 14/243 |
| 10,629,798 | B1 * | 4/2020 | Kallaher | H10N 60/10 |
| 10,707,401 | B2 * | 7/2020 | Brink | G06N 10/00 |
| 10,976,671 | B2 * | 4/2021 | Brink | G03F 1/36 |
| 11,024,792 | B2 * | 6/2021 | Ramakers | C23C 14/042 |
| 2003/0180474 | A1 | 9/2003 | Nishikawa | |
| 2009/0242875 | A1 | 10/2009 | Zhitenev | |
| 2011/0151190 | A1 * | 6/2011 | Chung | B82Y 10/00 |
| | | | | 977/773 |
| 2013/0217565 | A1 | 8/2013 | Kastalsky | |
| 2016/0276570 | A1 | 9/2016 | Chang et al. | |
| 2017/0133576 | A1 | 5/2017 | Marcus et al. | |
| 2017/0141287 | A1 | 5/2017 | Barkeshli et al. | |
| 2017/0250381 | A1 | 8/2017 | Okawara | |
| 2018/0358537 | A1 * | 12/2018 | Brink | H10N 60/805 |
| 2019/0296214 | A1 * | 9/2019 | Yoscovits | H10N 69/00 |
| 2021/0296560 | A1 | 9/2021 | Ramakers et al. | |
| 2022/0157932 | A1 | 5/2022 | Jespersen et al. | |
| 2023/0247918 | A1 | 8/2023 | Krogstrup Jeppesen | |

FOREIGN PATENT DOCUMENTS

| | | | | |
|---|---|---|---|---|
| CN | 105239156 | A | 1/2016 | |
| EP | 725449 | A1 * | 8/1996 | ........... H01L 39/025 |
| JP | 2010283206 | A | 12/2010 | |
| JP | 2014045111 | A | 3/2014 | |
| KR | 20150120543 | A | 10/2015 | |
| KR | 20150120546 | A | 10/2015 | |
| WO | 2016207415 | A1 | 12/2016 | |
| WO | WO-2017153388 | A1 * | 9/2017 | ........... C23C 14/042 |
| WO | 2019001753 | A1 | 1/2019 | |

OTHER PUBLICATIONS

"Notice of Allowance Issued in U.S. Appl. No. 16/484,088", dated Aug. 5, 2021, 9 Pages.
"Office Action Issued in European Patent Application No. 17808439.8", dated Sep. 29, 2021, 4 Pages.
"Office Action Issued in Japanese Patent Application No. 2019-571656", dated Dec. 7, 2021, 8 Pages.
"Non Final Office Action Issued in U.S. Appl. No. 16/627,703", dated Nov. 12, 2021, 12 Pages.
Vukajlovic-Plestina, et al., "Molecular Beam Epitaxy of InAs Nanowires in SiO2 Nanotube Templates: Challenges and Prospects for Integration of III-Vs on Si," In White Paper of Nanotechnology, vol. 27, Oct. 3, 2016, 10 Pages.
"Office Action Issued in Indian Patent Application No. 201947046467", dated Mar. 9, 2022, 6 Pages.
"Office Action Issued in Korean Patent Application No. 10-2020-7002956", dated May 6, 2022, 13 Pages.
"Final Office Action Issued in U.S. Appl. No. 16/627,703", dated May 25, 2022, 11 Pages.
"Extended Search Report Issued in European Patent Application No. 22167178.7", dated Jul. 14, 2022, 4 Pages.
"Extended Search Report Issued in European Patent Application No. 22167181.1", dated Jul. 12, 2022, 10 Pages.
"Notice of Allowance Issued in U.S. Appl. No. 16/627,703", dated Aug. 10, 2022, 8 Pages.
Liu, et al., "Fabrication of Microelectrodes on Diamond Anvil for the Resistance Measurement in High Pressure Experiment", In Article Microsystem Technologies, vol. 24, Issue 7, Jul. 1, 2018, pp. 3193-3199.
"Notice of Allowance Issued in European Patent Application No. 19880935.2", dated Aug. 9, 2022, 7 Pages.
"Office Action Issued in Australian Patent Application No. 2018367378", dated Sep. 13, 2022, 3 Pages.
"Office Action Issued in Japanese Patent Application No. 2019-571656", dated Jun. 28, 2022, 5 Pages.
Kanungo, et al., "Selective Area Growth of III-V Nanowires and their Heterostructures on Silicon in a Nanotube Template: Towards Monolithic Integration of Nano-Devices", In Journal of Nanotechnology, vol. 24, Issue 22, May 1, 2013, 6 Pages.
"Notice of Allowance Issued in Korean Patent Application No. 10-2020-7002956", dated Feb. 20, 2023, 8 Pages.
"Office Action Issued in Korean Patent Application No. 10-2020-7002956", dated Nov. 7, 2022, 7 Pages.
"Office Action Issued in Australian Patent Application No. 2018367378", dated Nov. 28, 2022, 3 Pages.
"Notice of Allowance Issued in Japanese Patent Application No. 2019-571656", dated Dec. 6, 2022, 5 Pages.
Krogstrup, et al., "Epitaxy of Semiconductor-superconductor nanowires", In Journal of Nature Materials, vol. 14, Jan. 12, 2015, pp. 400-406.
"Office Action Issued in Chinese Patent Application No. 201780092102.2", dated Mar. 13, 2023, 22 Pages.
"Office Action Issued in Indian Patent Application No. 202147029260", dated Feb. 2, 2023, 5 Pages.
"Office Action Issued in Indian Patent Application No. 202147032428" dated Feb. 21, 2023, 5 Pages.
U.S. Appl. No. 18/054,488, filed Nov. 10, 2022.
U.S. Appl. No. 16/627,703 / US-2020-0176663-A1 / filed Dec. 30, 2019 / Jun. 4, 2020.
"Notice of Allowance Issued in Australian Patent Application No. 2018367378", dated Apr. 20, 2023, 4 Pages.
"Non Final Office Action Issued in U.S. Appl. No. 17/332,908," dated Apr. 12, 2023, 10 Pages.
"Notice of Allowance Issued in European Patent Application No. 22167178.7," dated Mar. 30, 2023, 8 Pages.

(56) References Cited

OTHER PUBLICATIONS

"Non Final Office Action Issued in U.S. Appl. No. 18/054,488", dated Jul. 17, 2023, 12 Pages.
"Notice of Allowance Issued in European Patent Application No. 22167178.7", dated Jul. 20, 2023, 2 Pages.
"Office Action Issued in Chinese Patent Application No. 201780092102. 2," dated Aug. 1, 2023, 6 Pages.
"Notice of Allowance Issued in U.S. Appl. No. 17/332,908", dated Sep. 27, 2023, 7 Pages.
Oct. 26, 2018, U.S. Appl. No. 16/484,088, filed Aug. 6, 2019, Jan. 23, 2020, US-2020-0027919-A1, Apr. 5, 2022, U.S. Pat. No. 11,296,145.
Jan. 11, 2019, U.S. Appl. No. 16/246/289, filed Apr. 21, 2020, U.S. Pat. No. 10,629,798.
Oct. 26, 2018, PCT/US18/057841, May 23, 2019, WO2019/099171.
Nov. 30, 2017, 201780092102.2, Dec. 12, 2019, Jan. 31, 2020, CN110741486A.
Nov. 30, 2017, 17808439.8, Dec. 3, 2019, Apr. 22, 2020, U.S. Pat. No. 3,639,302.
NOv. 30, 2017, 201947046467, Nov. 14, 2019, Nov. 22, 2019, 201947046467A.
Nov. 30, 2017, 2019-571656, Dec. 25, 2019, Aug. 27, 2020, P2020-526021A.
Nov. 10, 2022, U.S. Appl. No. 18/054,488.
Nov. 30, 2017, U.S. Appl. No. 16/627,703, filed Dec. 30, 2019, Jun. 4, 2020, US-2020-0176663-A1.
Nov. 30, 2017, PCT/EP17/081038, Jan. 3, 2019, WO2019/001753.
Oct. 26, 2018, 18800020.2, May 15, 2020, Aug. 19, 2020, U.S. Pat. No. 3,695,440.
Nov. 30, 2017, 10-2020-7002956, Jan. 30, 2020, Feb. 21, 2020, 10-2020-0019247.
Jun. 30, 2017, U.S. Appl. No. 62/527,875.
Jan. 17, 2020, 202080009378.1, Jul. 15, 2021, Aug. 24, 2021, CN113302760A.
Jan. 17, 2020, 20705855.3, Jul. 9, 20201, Dec. 1, 2021, U.S. Pat. No. 3,915,152.
Apr. 7, 2022, 22167178.7, Aug. 17, 2022, U.S. Pat. No. 4,044,266.
Apr. 7, 2022, 22167181.1, Aug. 17, 2022, U.S. Pat. No. 4,044,267.
Jan. 17, 2020, 202147032428, Jul. 19, 2021, Jul. 23, 2021, 202147032428A.
JAn. 17, 2020, 10-2021-7022655, Jul. 16, 2021, Oct. 1, 2021, 10-2021-0118830.
May 27, 2021, U.S. Appl. No. 17/332,908, filed Sep. 23, 2021, US-2021-0296560-A1.
Jan. 25, 2019, U.S. Appl. No. 16/258,025, filed Jan. 30, 2020, US-2020-0243742-A1, Jun. 1, 2021, U.S. Pat. No. 11,024,792.
Jan. 17, 2020, PCT/US20/014202, Jul. 30, 2020, WO2020/154209.
Dec. 31, 2019, 201980088591.3, Jul. 9, 2021, Aug. 20. 2021, CN113287197A.
Dec. 31, 2019, 19880935.2, Jun. 29, 2021, U.S. Pat. No. 3,909,081.
Dec. 31, 2019, 202147029260, Jun. 29, 2021, Jul. 2, 2021, 202147029260A.
Dec. 31, 2019, 10-2021-7019145, Jun. 21, 2021, Sep. 23, 2021, 10-2021-0114394.
Dec. 31, 2019, PCT/US19/069024, Jul. 16, 2020, WO2020/146169.
Dec. 5, 2019, 201980102686.6, May 31, 2022, Jul. 12, 2022, CN1147466978A.
Dec. 5, 2019, 19828946.4, May 23, 2022, Oct. 12, 2022, U.S. Pat. No. 4,070,362.
Jun. 15, 2022, 22179312.8, Nov. 30, 2022, U.S. Pat. No. 4,095,886.
Dec. 5, 2019, 10-2022-7022916, Jul. 4, 2022, Aug. 5, 2022, 10-2022-0110271.
Dec. 5, 2019, U.S. Appl. No. 17/756,812, filed Jun. 2, 2022.
Dec. 5, 2019, PCT/US19/064705, Jun. 10, 2021, WO2021/112856.
Feb. 28, 2020, U.S. Appl. No. 17/904,794, filed Aug. 23, 2022.
Feb. 28, 2020, PCT/EP20/055338, Sep. 2, 2021, WO2021/170251.
U.S. Appl. No. 17/756,812 / US-2023-0008296-A1, filed Jun. 2, 2022 / Jan. 12, 2023.
U.S. Appl. No. 17/904,794 / US-2023-0106283-A1, filed Aug. 23, 2022 / Apr. 6, 2023.
U.S. Appl. No. 16/246,289 / U.S. Pat. No. 10,629,798, filed Jan. 11, 2019 / Apr. 21, 2020.
U.S. Appl. No. 18/054,488 / US-2023-0247918-A1, filed Nov. 10, 2022 / Aug. 3, 2023.
U.S. Appl. No. 16/627,703 / US-2020-0176663-A1 / U.S. Pat. No. 11,711,986, filed Dec. 30, 2019 / Jun. 4, 2020 / Jul. 25, 2023.
U.S. Appl. No. 17/332,908 / US-2021-0296560-A1, filed May 27, 2021 / Sep. 23, 2021.
U.S. Appl. No. 16/258,025 / US-2020-0243742-A1 / U.S. Pat. No. 11,024,792, filed Jan. 25, 2019 / Jul. 30, 2020 / Jun. 1, 2021.
Office Action Received for Korean Application No. 10-2021-7019145, mailed on Feb. 20, 2024, 25 pages (English Translation Provided).
Communication Pursuant to rule 71(3) EPC, Received for European Application No. 18800020.2, mailed on Jan. 15, 2024, 7 pages.
Office Action Received for Korean Application No. 10-2021-7022655, mailed on Feb. 29, 2024, 10 pages (English Translation Provided).
Notice of Allowance mailed on Jan. 3, 2024, in U.S. Appl. No. 18/054,488, 7 pages.
Notice of Allowance mailed on Jan. 29, 2024, in U.S. Appl. No. 17/332,908, 8 pages.
Office Action Received for Chinese Application No. 201780092102. 2, mailed on Dec. 6, 2023, 4 pages (English Translation Provided).
Invitation to Pay Additional Fees received for PCT Application No. PCT/US2018/057841, mailed on Mar. 21, 2019, 13 Pages.
Invitation to Pay Additional Fees received for PCT Application No. PCT/US2020/014202, mailed on Apr. 14, 2020, 8 Pages.
First Office Action Received for Chinese Application No. 202080009378.1, mailed on Jun. 26, 2024, 15 pages. (English Translation Provided).
Non-Final Office Action mailed on Apr. 10, 2024, in U.S. Appl. No. 17/332,908, 10 pages.
Decision to grant a European patent pursuant to Article 97(1), Received for European Application No. 18800020.2, mailed on May 24, 2024, 2 pages.
Notice of First Office Action Received for Chinese Application No. 201980088591.3, mailed on Apr. 3, 2024, 12 pages (English Translation Provided).

* cited by examiner

1) Deposition of dielectric mask including pillars for shadow mask

2) Selective area semiconductor growth

3) Superconductor growth/deposition including shadow mask

FABRICATION METHODS

CROSS REFERENCE TO RELATED APPLICATIONS

This application is a divisional of U.S. patent application Ser. No. 16/484,088, filed Aug. 6, 2019, which is the U.S. National Stage of International Application No. PCT/US2018/057841, filed Oct. 26, 2018, which was published in English under PCT Article 21(2), which claims priority to Great Britain Patent Application No. 1718897.0, filed Nov. 15, 2017, and which claims priority to International Application No. PCT/EP2017/081038, filed Nov. 30, 2017, all of which are incorporated herein by reference in their entirety.

TECHNICAL FIELD

This application relates to the fabrication of structures such as nanoscale devices by means of selective material deposition. An example application is the fabrication of superconductor-semiconductor platforms, such as semiconductor-superconductor platforms for use in quantum computers.

BACKGROUND

Quantum computing is a class of computing in which inherently quantum mechanical phenomena, such as quantum state superposition and entanglement, are harnessed to perform certain computations far more quickly than any classical computer could ever be capable of. In a "topological" quantum computer, calculations are performed by manipulating quasiparticles—called "non-abelian anyons"—that occur in certain physical systems. Anyons have unique physical characteristics that distinguish them from both fermions and bosons. Non-abelian anyons also have unique properties with respect to abelian anyons. It is these unique properties that serve as a basis for topological quantum computing, in which information is encoded as a topological property of non-abelian anyons; specifically the braiding of their space-time worldlines. This has certain benefits over other models of quantum computation. One key benefit is stability, as the quantum braiding is unaffected by perturbations on a scale that could cause error-inducing quantum decoherence in other types of quantum computer.

Broadly speaking, to date, two types of physical system have been considered as potential hosts of non-abelian anyons, namely "5/2 fractional quantum Hall" systems in condensed matter physics, and (more recently) semiconductor-superconductor (SE/SU) nanowires. Regarding the latter, a key advance in the field was the realization that non-abelian anyons, in the form of "Majorana zero modes" (MZMs) can be formed in semiconductor (SE) nanowires (NWs) coupled to a superconductor (SU).

One of the issues encountered in the context of SE/SU nanowires is the existence of so-called "soft gap" states. The soft gap issue has been documented in publicly-available literature, and suffice it to say that these soft gap states, when present, are a source of decoherence for the MZMs. Analysis and experiments indicate that a source of the soft gap is disorder in the SE/SU interface, and there has been recent work in the field on improving the quality of the SE/SU interface with the aim of providing more stable MZMs.

SUMMARY

A first aspect of the present disclosure provides a fabrication method comprising the following steps. At least one structure is formed on the substrate which protrudes outwardly from a plane of the substrate. A beam is used to form a layer of material, at least part of which is in direct contact with a semiconductor structure on the substrate, the semiconductor structure comprising at least one nanowire. The beam has a non-zero angle of incidence relative to the normal of the plane of the substrate such that the beam is incident on one side of the protruding structure, thereby preventing a portion of the nanowire in a shadow region adjacent the other side of the protruding structure in the plane of the substrate from being covered with the material.

A second aspect of the present disclosure provides a method of fabricating a pattern on a substrate comprising the following steps. A patterning structure is formed on the substrate, the patterning structure comprising one or more shadow walls extending outwardly from a plane in which a surface of the substrate substantially lies. In a first deposition phase, a first layer of material is selectively deposited on the surface of the substrate using a first beam. In a second deposition phase, a second layer of material is selectively deposited on the surface of the substrate using a second beam. The first and second beams have a non-zero angle of incidence relative to an axis normal to the surface of the substrate and different azimuthal angles about said axis, such that, in the first deposition phase, the first beam is incident on one side of a shadow wall of the patterning structure whereby the shadow wall prevents deposition in a first exposed shadow region adjacent the opposite side of the shadow wall in the plane of the substrate, and, in the second deposition phase, the second beam is incident on one side of the shadow wall or another shadow wall of the patterning structure whereby that shadow wall prevents deposition in a second exposed shadow region adjacent the opposite side of that shadow wall in the plane of the substrate.

A third aspect of the present disclosure provides a fabrication method comprising the following steps. At least one structure is formed on the substrate which protrudes outwardly from a plane in which a surface of the substrate substantially lies. At least one device to be patterned is transferred to the surface of the substrate. A beam is used to selectively deposit a layer of material on the device once transferred to the surface of the substrate. The beam has a non-zero angle of incidence relative to the normal of the plane of the substrate such that the beam is incident on one side of the protruding structure, thereby preventing a portion of device in a shadow region adjacent the other side of the protruding structure in the plane of the substrate from being covered with the material.

DETAILED DESCRIPTION OF EMBODIMENTS

Figure 1A:
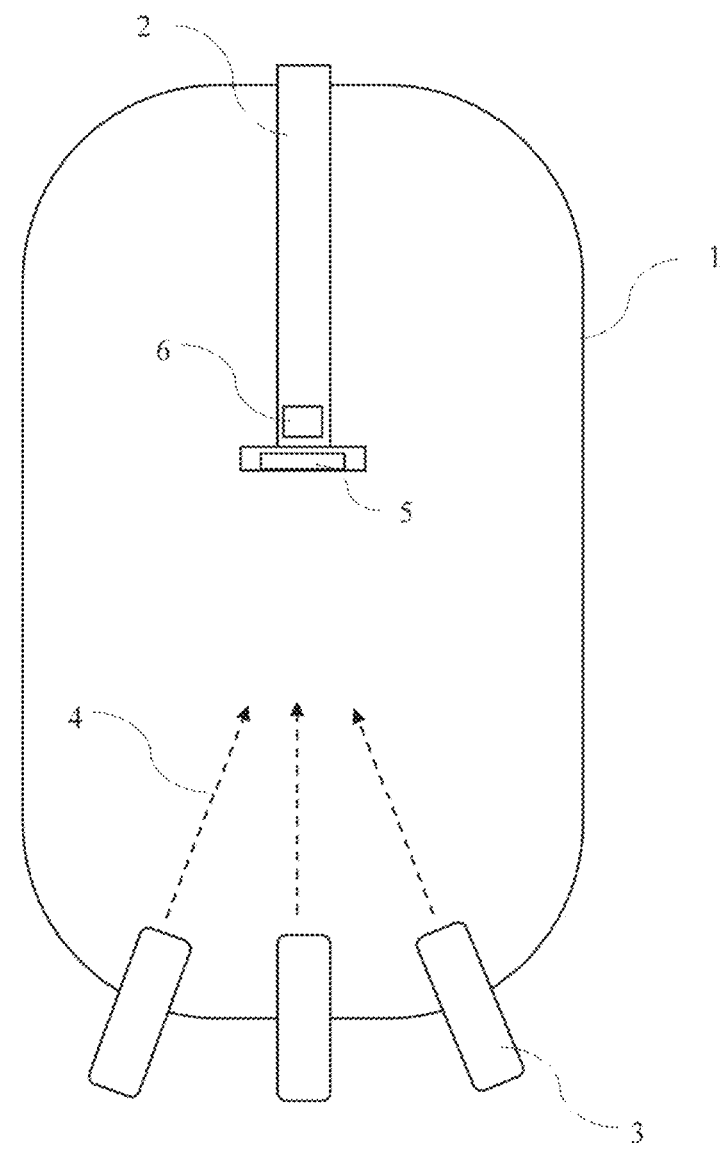
FIG. 1A shows an example of a system for performing a fabrication method.

In the examples of fabrication technology described herein, purpose-built structures are used to cast "shadows" that create patterned nanoscale structures during a directional deposition of material on a substrate. The terms "shadow wall", "smart wall" or simply "wall" may be used interchangeably herein to refer to such structures, which protrude outwardly of the substrate. This allows predefined regions of the substrate to be excluded from the deposition of the material, thereby creating nanoscale patterns. Such regions may be referred to as "shadow regions", these being regions in which deposition is prevented because the shadow walls inhibit the passage of the deposition material into those regions. These regions are exposed regions of the surface of the substrate adjacent the shadow walls (i.e. they are next to the shadow walls on the surface of the substrate, not underneath them). The deposition beam is performed using an angled beam, and because the shadow walls protrude outwardly from the surface of the substrate, they selectively prevent deposition in exposed shadow regions adjacent the opposite sides of the shadow walls to which the beam is incident.

In an optional extension of the process, by varying the angle at which deposited material reaches the surface between depositions—and, in particular by varying the rotational (azimuthal) angle of the beam relative to the substrate (that is, the angle around the normal to the surface of the substrate, i.e. the z axis with the substrate lying in the x-y plane)—a different structure can be created for each deposition, thereby creating a composite structure. This is described in further detail later.

This is an alternative to using hard masks or resist for defining patterns and subsequent etching. Traditional lithography techniques use chemical etching to create nanoscale patterns. However, chemical contact with a device region can lead to degradation of the surface properties of the patterned material, resulting in lower device quality. In contrast to such techniques, the described technology does not require any contact of chemicals with the device region in embodiments where a nanostructure to be patterned is grown on the substrate, which prevents unwanted modifications to the contact surface during patterning. In embodiments where the nanostructure is transferred to the substrate, native oxide may need to be removed from the surface of the wire before the structures can be built up on the wire. This can be achieved by employing hydrogen plasma or thermal de-oxidation in a vacuum or gaseous atmosphere.

Externally growing and transferring the nanowires is beneficial in some respects as there are much less strict material requirements in that event. This is because the shadow walls and the growth of nanostructures are independent steps.

Hard stencil masks could also be used to create nanostructures. However, precise mechanical positioning of a mask is required, which requires the introduction of complex additional machinery in the deposition chamber. Moreover, in the case that multiple depositions are needed for a single device, a new stencil mask is required for each new deposition which significantly increases the complexity of the process and the potential for error. By contrast, the described embodiment's use lithographic positioning of the shadow walls that enable selective deposition. This is both more accurate and easier to implement than deposition using hard masks.

The deposited material may for example be a superconductor, metal, or dielectric. Some example materials are mentioned herein, but it will be appreciated that other materials may be used.

The material may be deposited or partially deposited on a nanoscale device, such as a semiconductor nanowire. By way of example, semiconductor nanowires wires with a coating (or partial coating) of superconductor material have applications in topological quantum computing.

The described technology can be used to selectively deposit superconductor on one or more semiconductor nanowires or complex networks of nanostructures, in order to create quantum circuits that may be used in a quantum computer. However, the described techniques can also be applied more generally to the fabrication of nanostructures which have practical uses in other contexts.

The following discloses a method for fabricating nanoscale devices. Large scale devices may be formed from multiple smaller nanodevices. Implementations of such devices are relevant to the fields of quantum electronics and optics, for example. It is important that the nanodevices are fabricated in a way in which the possibility of impurities forming, resulting in non-ideal interfaces between the layers of deposits, is low. Any non-ideal interfaces may result in the degradation of the signal quality as signals pass through that components. Since the large scale devices are made up of multiple nanodevices, it is important that signal quality degradation in each nanodevice is minimised.

FIG. 1A shows an example of a system comprising a vacuum chamber 1, preferably an ultra-high vacuum (UHV) chamber, in which the method disclosed can be performed. Other vacuum chambers, such as HV chambers, may also be used. The chamber 1 comprises a support 2 which supports a substrate 5 in the vacuum chamber 1 during the depositing process. The term substrate is used in this context to refer to a wafer 10 plus any structure formed on the wafer 10.

Figure 1B:
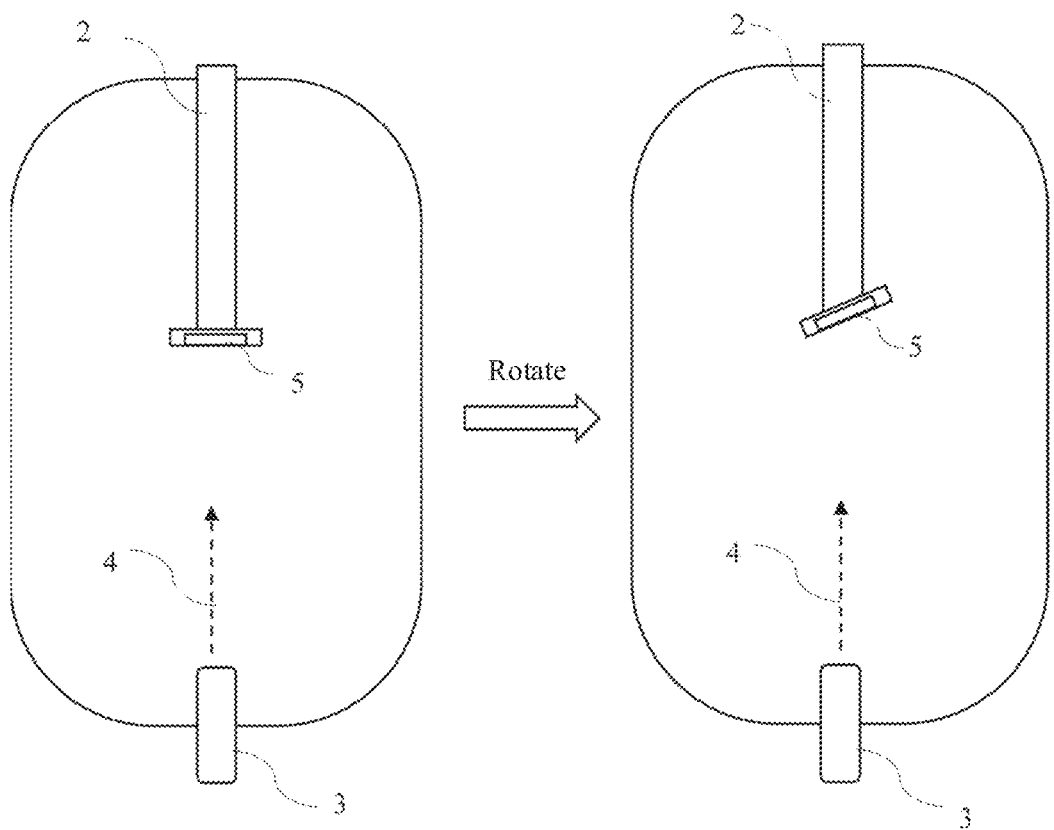
FIG. 1B shows how a beam deposition angle may be varied by rotating the sample support.

That is to say, for the present purposes the "wafer" will be taken herein to refer to the base layer, and the "substrate" will refer to the wafer plus any other layers already deposited over the wafer at the current stage in the fabrication process, including smart walls, masks, deposited material etc. It is noted however that references to layers, components, structures etc. on a wafer does not necessarily mean those layers/components/structures etc. have to be in direct contact with the surface of the wafer (so in a multi-layered substrate, all of those layers are said to be on the wafer). In some embodiments, the sample support 2 takes the form of a sample manipulation column. The chamber 1 also comprises one or more source cells 3, each comprising a quantity of a material 4 to be deposited but in its source form, e.g. a solid or liquid. The source cell(s) 3 may be fixed or movable. The angle at which the material 4 is deposited on the substrate 5 may be changed by moving, tilting, and/or rotating the substrate 5. This may be achieved by manipulating the sample manipulation column 2, as shown in FIG. 1B. Alternatively or additionally, movable source cells 3 may increases the range of angles possible over fixed source cells 3. Deposition angels are discussed later.

In some embodiments, the deposition technique used is molecular beam epitaxy (MBE). Techniques such as MBE performed in a UHV chamber can give a high material purity and quality. In some embodiments employing MBE or such like, each source cell 3 comprises a compartment holding the source material 4 and has an opening out into the vacuum chamber 1. Each source cell 3 also comprises an energization means to energize the source material 4, such as by heating, to thereby cause the material 4 to be ejected from the cell into the chamber in the form of a beam towards the substrate 5 held on the sample support 2. For example, the energization means may take the form of an effusion cell or an electron beam evaporator. For instance, in an effusion cell the material is heated by an electrical heating coil, and the material then diffuses out through a small aperture (this is called effusion). In an e-beam evaporator the material is energized by a beam of accelerated electrons. Other methods of energizing the source material 4 may also be used. The deposition material 4 may be ejected in the form of directional beam of molecules or atoms. It will be appreciated that any direction deposition technique may alternatively be used for depositing material 4, which may be performed in a vacuum or not.

In some embodiments, the sample manipulation column 2 also contains a temperature regulation device 6 which can be used to heat or cool the substrate 5 to the required temperature. For high quality material growth the substrate 5 typically should be kept at specific temperatures, which can be significantly below or above the room temperature. Temperatures may be in the range of 0K to >1200K.

Figure 2:
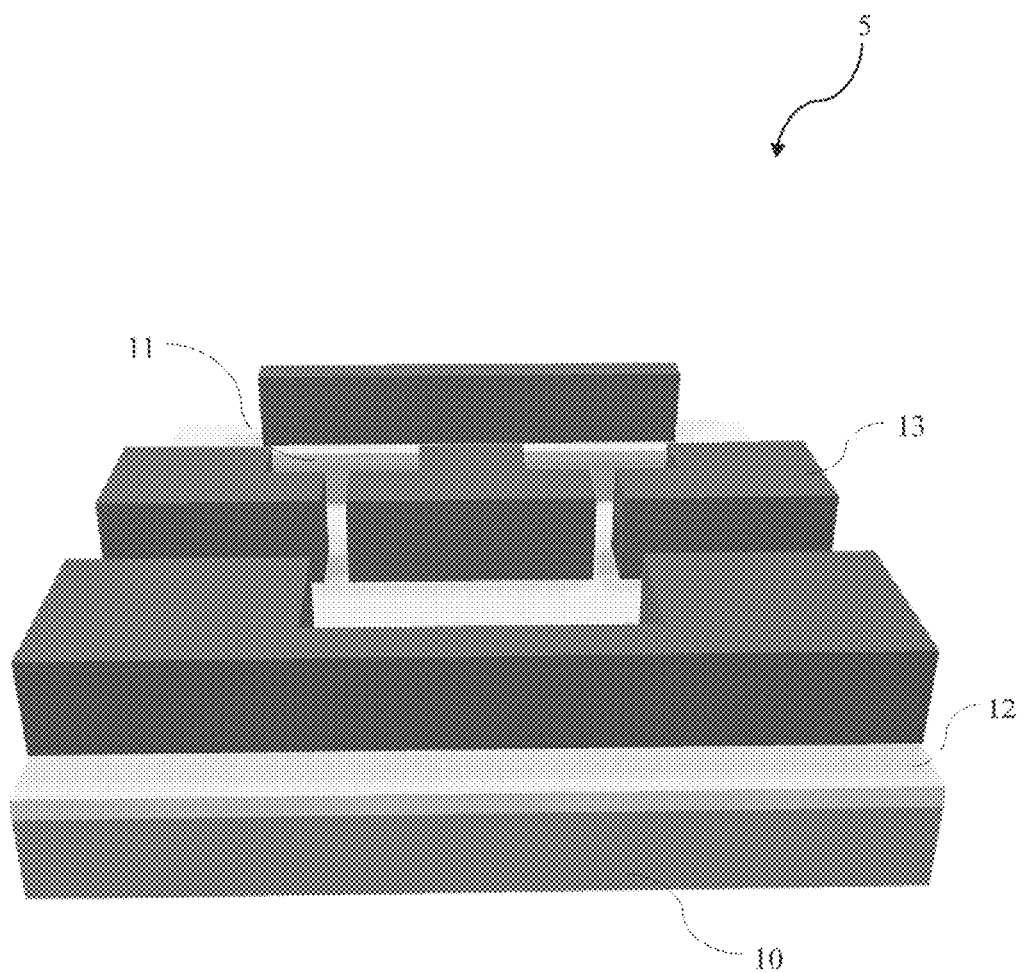
FIG. 2 shows an example structure for generating desired patterns of deposited material.

FIG. 2 shows an example of a shadow wall arrangement which may be used to create a nanostructure using the described method.

To create a desired nanoscale pattern on the device 11, walls 13 are constructed on the wafer 10. The device 11 is a semiconductor structure which can be formed on the substrate 5 in various ways. For example, components of the device 11 (such as individual nanowires) can be formed externally (i.e. not on the substrate 5 itself) and transferred onto the substrate 5 to form the structure of the device 11. These may be formed using a vapour-liquid-solid (VLS) method, out-of-plane selective area growth, or the device 11 may be another type of transferrable nanostructure. As another example, the device 11 can be grown on the substrate 5 itself using selective area growth (SAG).

An example of this is described in further detail later. Other types of grown nanostructures may also be used.

A mask layer 12 may be formed on an upper surface the wafer 10. This amorphous mask 12 may be made of a dielectric material. The mask 12 may be required only in the case of SAG. For transferred wires no mask is not required (though a mask can be used with transferred wires in certain use cases). Note, the purpose of the mask 12 is to prevent direct contact of the material 4 with the upper surface of the wafer 10, rather than to generate the desired nanoscale pattern. This is beneficial when non-insulating wafers are used. The mask 12 also allows for the formation of the device 11 in the desired location, as a gap is left in the mask 12 where required.

The mask 12 may have gaps in it, such that some areas of the surface of the wafer 10 are left exposed. These gaps may be occupied by one or more devices 11, such as a semiconductor nanowire(s). At least part of the desired nanoscale pattern is formed on the device 11, as described below.

One or more shadow walls 13 are created on top of the mask 12, i.e. on the opposite side of the mask 12 to the wafer 10. The walls 13 are protruding structures which can be integral with and formed from the same material as the mask 12. Alternatively, the walls 13 may be formed from a material different to that of the mask 12. For example, in the case of transferred devices 11, walls 13 made of tungsten may be used. In the case of SAG, amorphous materials are preferable. The walls 13 and mask 12 may be formed using lithography techniques as described later.

The pressure in an UHV may be lower than $10^{-7}$ Pa. The fabrication process may be performed over a large temperature range, for example 0K to >1200K. Thus, any materials used to create the walls 13, which are used to prevent the deposition of material 4 on certain areas of the device 11, must be capable of withstanding these conditions. Any degradation of the walls 13 during the fabrication process may result in material 4 being deposited in areas of the device 11 or wafer 10 it was not intended to be, so altering the functionality of the resultant device. Inorganic dielectric materials (such as silicon nitrate, aluminium oxide etc.) generally meet these requirements, although other materials may also be used, such as tungsten. Thus, an inorganic material, such as silicon nitride is used to form the walls 13. Other robust materials or their combination may be used for the walls 13, for example silicon oxide, aluminium oxide, tungsten, etc.

The walls 13 may be created by etching. The dielectric material to be used for the walls 13, such as silicon nitrite, is deposited on either on the mask 12 (if the mask layer is formed first) or on the surface of the wafer 10 directly (if the walls 13 and mask layer 12 are formed together). The amorphous layer may cover the entire mask 12 or just a portion of the mask 12. The depth of the deposited dielectric is the maximum height of walls 13 to be created. The pattern to be generated by the deposition material 4 on the device 11 may determine the height and location of the walls 13 and the angle at which the material 4 is to be projected at the substrate 5.

Once the dielectric material has been deposited to the desired depth, an etching pattern is formed on the exposed face of the dielectric material. This pattern may be formed of photoresist, and lithography may be used to selectively remove parts of the photoresist in order to create the etching pattern. The etching pattern leaves selective regions of the dielectric exposed, which are then etched away—thus forming the walls 13 in the regions protected by the remaining photoresist.

Etching techniques are then used to remove the silicon nitride from the areas where the pattern was drawn, such that the walls 13 are left. Dry etching or wet etching may be used to remove the unwanted silicon nitride. In dry etching, the material to be removed is exposed to a bombardment of ions that dislodge portions of the material from the surface.

Where the mask layer 12 and the walls 13 are formed of the same material, the etching is terminated upon reaching a desired depth of the mask layer 12. Where appropriate, further etching may be used after this to create a region of exposed wafer 10 (i.e. in which the upper surface of the wafer is directly exposed), such as an exposed region in which the device 11 is located, in direct contact with the surface of the wafer 10.

However it is formed, the device 11 may be next to or between the walls 13. As noted, the device 11 may be grown in the exposed region in the mask 12 which has been left for it such that there is an electrical interface between the device 11 and the substrate 10. This is described in further detail later. In this method, the device 11 is grown in the UHV chamber 1. Also, any interfaces between the device 11 and the deposition material 4 are better than if the device 11 were grown outside of the chamber since no oxidation of the surfaces would have occurred, and the surface of the device 11 does not have to be cleaned. In an alternative embodiment, there may be multiple connected UHV chambers 11 such that the device 11 may be grown in one and transferred to another for material deposition without being exposed to the atmosphere.

Figure 3A:
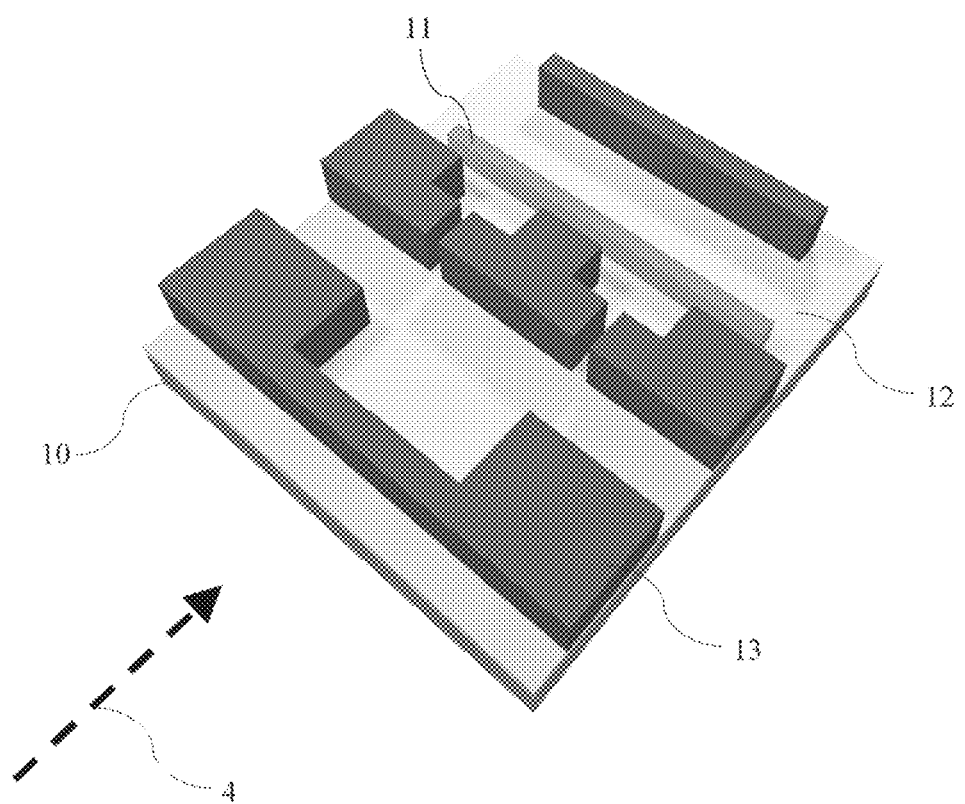
FIGS. 3A and 3B show a process of depositing a material to generate desired patterns.

FIG. 3A shows a perspective view of the wafer 10 in which the calls 13 and mask have been formed in a selective deposition process. The device 11 may have been grown on or transferred onto the substrate 5.

Once the walls 13 have been created in their desired locations and the device 11 has been grown, the material 4 can be selectively deposited at the device 11, as shown in FIG. 3A. The material 4 is projected from the source cell 3 (see FIG. 1A) towards the device 11 in a direction determined by an angle of the beam of material 4 relative to the shadow walls 13 or, more precisely, an angle of incidence (angle of the beam relative to the direction normal to the surface of the substrate) and azimuth (angle of the beam in the plane of the substrate) of the beam of material 4. The azimuthal angle may be changed between deposition phases to create a composite structure, whilst the angle of incidence remains substantially fixed.

Figure 3B:
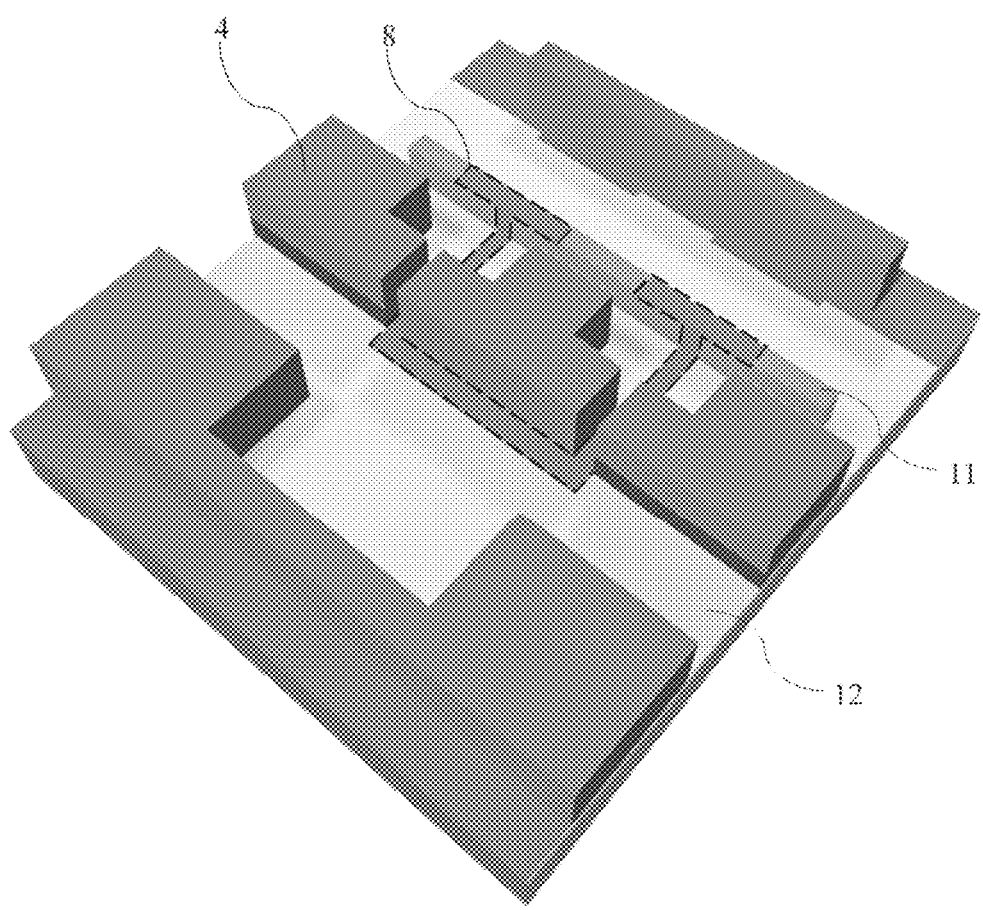

FIG. 3B shows the substrate 5 after the deposition of material 4. It can be seen that the walls 13 have acted as shadow walls, creating areas on the device 11 which the material 4 has not been deposited on. A nanoscale pattern 8 has been created on the device 11 and on the mask 12, defined by the areas outside of the shadow regions defined by the walls 13.

The material 4 may be a superconductor such as aluminium. This may be stored as a solid in the source cells 3 and evaporated in order to be projected at the device 11. By coating the semiconductor device 11 with a superconducting material 4 such as aluminium, a network of semiconductor-superconductor nanowires may be created, as described in further detail below. One or more additional depositions may follow. The material 4 deposited in the subsequent depositions may be the same material 4 as in the first deposition, or the material 4 may vary with each deposition. For example, a dielectric may be deposited on the device 11 in a second deposition. The angle at which the material 4 is deposited may also vary with each deposition. By varying the angle, different patterns can be created on the device 11.

Figure 4A:
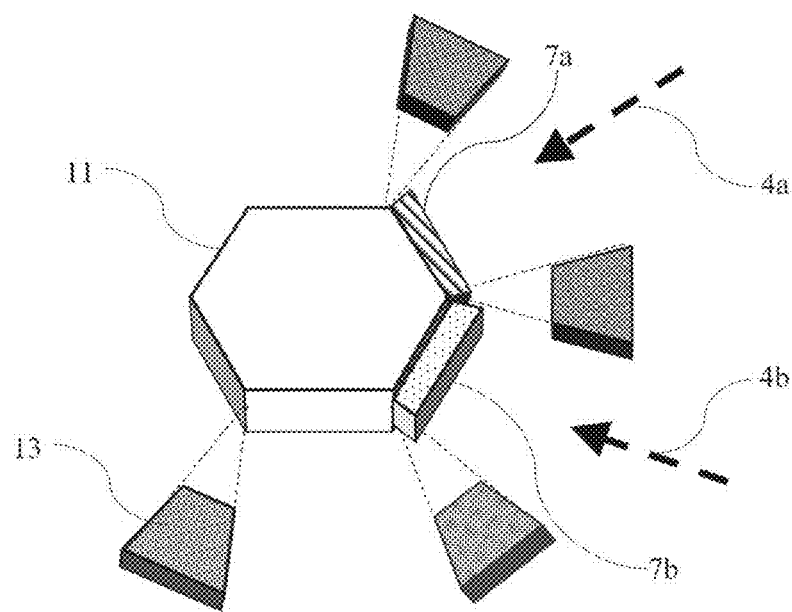
FIGS. 4A, 4B, and 4C show examples of possible wall layouts to generate different patterns using multiple material depositions.
Figure 4B:
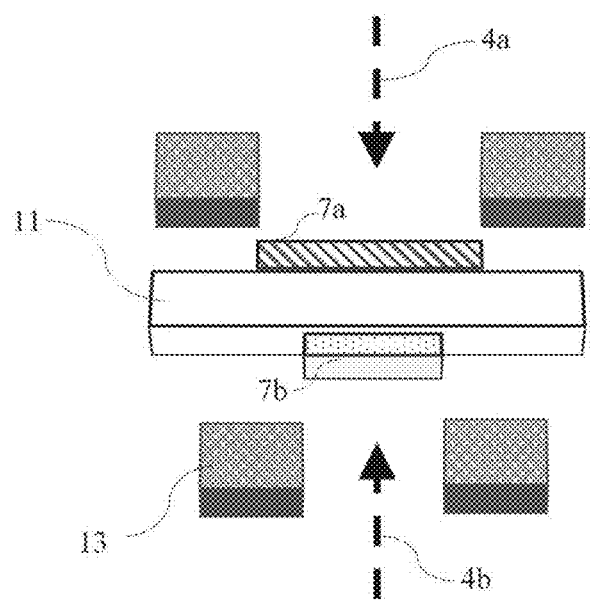
Figure 4C:
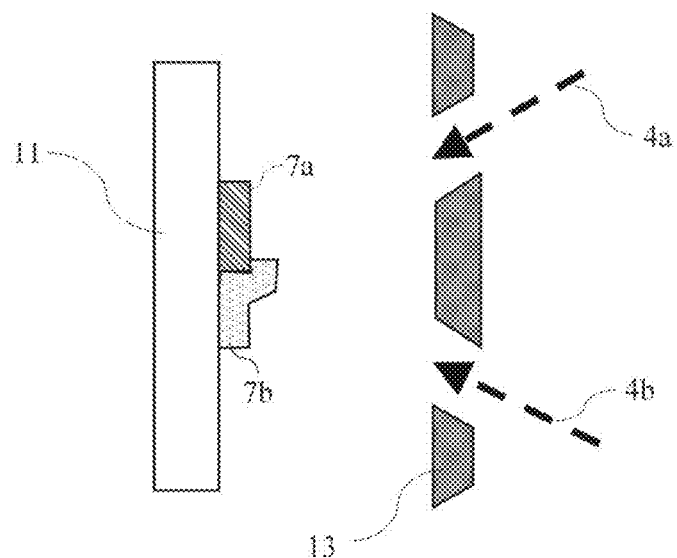

FIGS. 4A, 4B, and 4C show examples of structures generated using multiple depositions. In each of these example, two depositions occur, first of material 4a producing deposit 7a, followed by material 4b producing deposit 7b. The second material deposition 4b occurs from a different angle to the first material deposition 4a. Materials 4a and 4b may be the same material or they may be different materials. It will be appreciated that there may be more than two depositions, with one or more materials 4 deposited.

In FIGS. 4A and 4B, the walls 13 are positioned on multiple sides of the device 11. This allows the pattern to be created on more than one side of the device 11 if required without the need to move, add to, remove, and/or change any part of the substrate 5.

FIG. 4C shows a layout in which the second deposit 7b shares a footprint on the device 11 with the first deposit 7a. Thus, the second deposit 7b forms on top of the first deposit 7a in the overlapping area.

As can be seen in FIGS. 4A, 4B, and 4C, the walls 13 may be in any location with respect to the device, and may take any shape which is feasible with the available tools. The shape and location of the walls defines the shape and location of the deposits 7a, 7b. It will be appreciated that other objects may be used to create shadows instead of or as well as the walls 13. For example, nanowires may be used to block some areas from the projected material 4.

By varying the deposition angle between the subsequent depositions, different structures are created for each deposition, so allowing more complex patterns to be produced on the device 11 than if a single deposition from one angle was used.

The thickness of the deposits 7a, 7b are determined by the rate and time period of projection. Thus, thinner deposits 7a, 7b can be created by projecting the material 4 for either a shorter period of time or at a lower rate, or both. The thickness of the deposits may vary the resultant properties of the nanostructures formed from the process.

The purity of the final device is important. Impurities lead to the degradation of signals as they pass through the devices due the interfaces between the different materials not being of high quality. Since the resultant structures produced are a combination of a number of these devices, a structure made up of many devices containing impurities will have a large degradation of the signal.

The method presented herein allows the purity of the materials used to remain as high as possible. This is because the entire process can be performed within the UHV chamber, so there will be no contact with air which may lead to the oxidation of the metals, for example. In addition, there is no chemical contact with the substrate or with chemical solvents used to remove resist masks, which may also lead to material degradation.

The materials used in the substrate 5 (material 4, wafer 10, device 11) should also be sufficiently pure for the desired use. It is beneficial if the materials can be easily cleaned to remove impurities in the cases when impurities do form.

By way of further example, an example use-case will now be described in which smart walls are used in conjunction with selective area growth of nanowires. However, as noted above, the present disclosure is not limited in this respect, and the nanowires that form the nanostructure to be patterned can instead be prepared externally and transferred to the substrate for patterning. Epitaxial semiconductor-superconductor materials are a promising platform for gatable low-dissipation superconducting electronics and superconducting quantum computation. In the context of topological quantum computing, superconducting nanowires with strong spin-orbit coupling can support topological excitations that can serve as the basis for fault tolerant quantum information processing.

Current approaches to synthesize semiconductor-superconductor materials for gatable superconducting nanowire electronics are either based on two-dimensional planar materials (see, e.g., Shabani et al. PRB 93, 155402 (2016)) or bottom up grown nanowire materials (see, e.g., Krogstrup et al. Nature Mater. 14, 400-406 (2015)). Both approaches are facing challenges with scalability for different reasons. Regarding the latter approach, this has been able to achieve a very high quality SE/SU interface. However, with this approach, the SE/SU nanowires to form part of a network have to be individually grown and, once grown, individually placed on an insulating material to form the actual network. Thus, scaling up this approach to larger networks presents very significant challenges.

Example embodiments of the disclosed technology provide a solution to the problem of scalability by combining SAG semiconductors with a superconducting phase.

Figure 5:
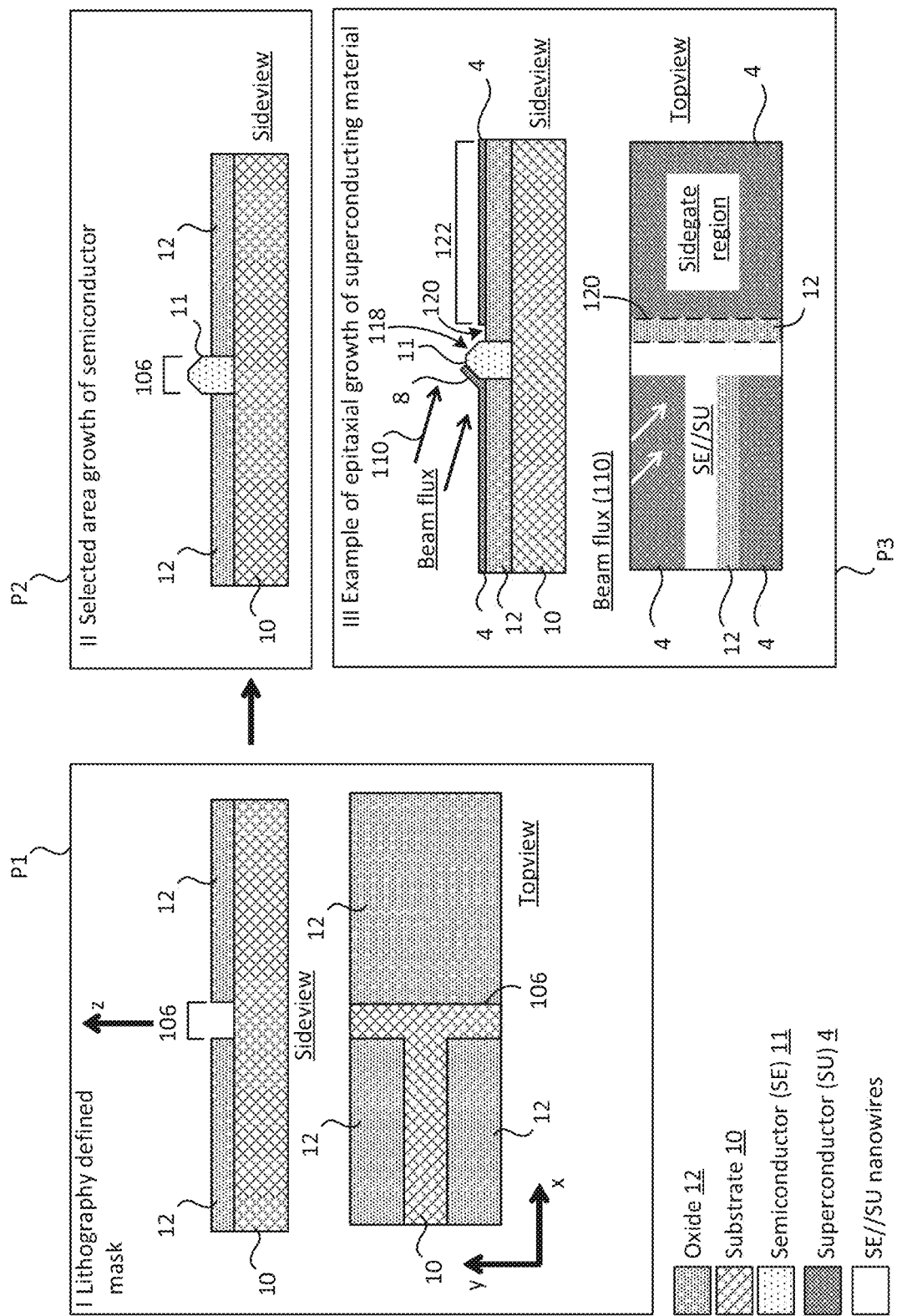
FIG. 5 shows a schematic illustration of a method of fabricating a network of SE/SU nanowires.

With reference to FIG. 5, an example three-phase fabrication method will now be described. The fabrication method can be used to create a network of SE/SU nanowires, which in turn can for example form the basis of a quantum circuit (e.g. for a quantum computer) or other mixed semiconductor-superconductor platform. In particular, the method is particularly suitable for fabricating a SE/SU nanowire network capable of hosting stable MZMs, with no or significantly reduced soft gap decoherence, which can form the basis of fault-free topological quantum computations.

It is noted, however, that although the material platform is relevant for quantum computing, the gatable superconducting electronics it provides may well have other applications outside of or which are not directly related to quantum computing, particularly in contexts where low energy dissipation is required.

As will become apparent, because the SE/SU nanowire network is created using SAG, an entire nanowire network can be fabricated as a whole on an insulating substrate. The insulating substrate and the nanowire can incorporated directly into the final product, without any need to transfer the nanowires to a different surface. Thus the method is significantly more saleable than the existing approaches.

1) Masking Phase

In a first phase P1 (masking phase) a patterned layer of dielectric material 12 (dielectric mask) is formed on top of an insulating substrate 10. A side-view and a top-view of the substrate 10 with the dielectric mask 12 are shown on the left hand side of FIG. 5. The substrate 10 can be formed of any suitable substrate material such as InP (Indium Phosphide), and is an insulating substrate in the described examples. In the described examples, the dielectric material 12 is an oxide but it can be any dielectric material that facilitates SAG in a second phase P2 of the fabrication method (see below).

The oxide layer is patterned in that the oxide layer 12 is formed so as to leave narrow strips of the substrate—in a desired region 106—exposed (i.e. not covered by the oxide 12). The pattern in this context refers to the structure of the desired region 106, which will ultimately become the structure of the nanowire network, as it is this exposed region 106 in which SE nanowires are prepared. Accordingly, the size and structure of the nanowires matches the size and structure of the exposed region 106. Although only one exposed region 106 is shown in FIG. 5, nanowires can be grown simultaneously in multiple regions and all description pertaining to the desired region 106 applies equally to multiple such regions. Accordingly, the structure of an entire nanowire network can be defined by the structure of the exposed region(s). In this example, the strips and hence the resulting nanowires have a width of the order of tens or hundreds of nanometers.

The oxide layer 12 can be formed so as to leave the desired region 106 exposed in any suitable manner. For example, a uniform, continuous layer of oxide can be deposited on the substrate 10, and the exposed region 106 can then be formed by selectively etching away the oxide 12 from the desired region 106 (in this case, it is the etching that defines the eventual nanowire network structure). As another example, the oxide layer 12 can be selectively deposited on the substrate 10 with a mask used to prevent deposition of the oxide 12 in the desired regions 106 (in this case, it is the mask that defined the eventual nanowire network structure).

The SAG nanowires are defined along high symmetry in-plane crystal orientations on the substrate, which also gives well-defined faceting of the nanowires. This makes the SU/SE interface flat, potentially atomically flat, and well defined.

2) SAG Phase

In the second phase P2, namely the SAG phase, a semiconductor material 11 is selectively grown within the desired regions 106, on top of the exposed portion of the substrate 10. An example is illustrated at the top right of FIG. 5, at which a side-view of the substrate 10 is shown. Due to the patterning of the oxide layer 12, the selectively grown semiconductor 11 forms in-plane nanowires (that is, nanowires lying in the place of the substrate 10).

SAG is a growth method using crystal growth vacuum chambers. SAG refers to localized growth of semiconductor in exposed regions of the substrate, with growth conditions selected to prevent such growth on the dielectric mask itself. This can be based on Chemical Beam Epitaxy (CBE), Molecular Beam Epitaxy (MBE), or Metal-Organic Chemical Vapour Deposition (MOCVD), for example. In the context of semiconductors, SAG refers to a particular class of epitaxial semiconductor growth (and is also referred to as selective area epitaxy), in which a patterned dielectric mask is used to define the intended structure of the semiconductor material to be grown (a form of lithography). The SAG process is tuned such that semiconductor growth occurs only on regions of the substrate that are not covered by the dielectric mask, and not on the dielectric mask itself. This is quite different from other deposition/growth processes, such as bottom up growth (in which no mask is used) and uniform deposition (epitaxial or otherwise) in which material is uniformly deposited across a surface irrespective its material composition (as in phase P3—see below). SAG is conducted in a high or ultra-high vacuum, and requires careful tuning to achieve the desired selective semiconductor growth.

Any suitable SAG process can be used in the second phase P2 to create the desired SE nanowires in the exposed region 106.

SAG per-se is known, and is therefore not discussed in further detail herein. For further description of SAG, see, e.g., G. J Davies *Proc.* SPIE 2140, Epitaxial Growth Processes, 58 (May 11, 1994); doi:10.1117/12.175795; M Fahed, Doctoral thesis: Selective area growth of in-plane III-V nanostructures using molecular beam epitaxy, 2016. http://www.theses.fr/2016LIL10114; Fukui et al, Appl. Phys. Lett. 58, 2018 (1991); doi: http://dx.doi.org/10.1063/1.105026.

Suffice it to say that the SAG phase P2 is such that, at the end of that phase, the semiconductor material 11 fills the desired region 106 (that is, the region 106 in which the substrate 10 is not covered by the oxide mask 12) but does not extend, in the plane of the substrate 10 (xy-plane hereafter), beyond the boundaries of the desired region 106 as defined the oxide layer 12. However, as can be seen, it does extend outwardly in a direction normal (perpendicular)

to the plane of the substrate 10 (z-direction hereafter) so as to protrude outwardly of the oxide mask 12. That is, the semiconductor material 11 extends a greater distance from the substrate 10 than the oxide layer 12 in the z-direction. In this manner, the semiconductor material 11 forms nanowires lying substantially in the plane of the substrate 12 (in-place nanowires).

The semiconductor material 11 can be any suitable semiconductor material, such as Indium arsenide (InAs). The SAG semiconductor 11 can for example be confined 2DEG (two-dimensional electron gas) semiconductor or single material semiconductor.

3) Superconductor Growth Phase

In a third phase P3 (superconductor growth phase) a layer of superconducting material 4 is grown using a particle beam 110. Herein, a superconducting material means a material that exhibits superconducting properties at least under certain conditions. An example of such a material is aluminum (Al). In the following examples, the superconductor is grown epitaxially in phase P3, and the superconductor growth phase P3 may be referred to as an epitaxial growth phase in this context. However, the technology is not limited in this respect, and it may be possible to achieve the intended result via non-epitaxial superconductor growth in phase P3. The superconducting material 4 can be grown in phase P3 using molecular beam epitaxy (MBE) electron gun epitaxy, for example.

At least part of the superconductor layer 4 is deposited on top of the SE nanowire 11 such that this part of the superconductor layer 4 (labelled 8 in FIG. 5) is in direct contact with the SE nanowire 11. That is, such that the SE nanowire 11 is at least partially covered with superconducting material.

This is also a form of epitaxy, but it is not SAG. In particular, in the epitaxial growth phase P3, epitaxial growth does occur on the oxide layer 12, as well as on the SE nanowires 11.

The beam can be angled in substantially the z-direction such that essentially all of the exposed surfaces of the oxide layer 12 and the SE material 11 are covered by the SU layer 4. However, in this example, the particle beam 110 is incident on the substrate 10 with a non-zero angle of incidence relative to the z-direction (deposition angle). As a consequence of this non-zero deposition angle and the protruding structure of the SE nanowire 11, the SE nanowire 11 is only partially coated by the superconductor layer 4; that is, a part of the SE nanowire (labelled 118) is not coated by the superconductor material. The bulk of the oxide layer 12 is also coated by the superconductor layer 4, however due to the angle of the incoming beam 110 and the protruding structure of the SE nanowires 11, small regions of the oxide layer 12 (shadow regions) immediately adjacent the protruding SE nanowires 11 are left exposed, i.e. not coated by the SU material. One such shadow region is labelled 120 in FIG. 5. The shadow region 120 separates the SE material 11 from a portion of the SU layer 4 in a "sidegate" region 122. The portion of the SU layer 4 in the sidegate region 122 can be used to form a gate for controlling the SE nanowires 11, or (more likely) the SU material can be etched away from this region and replaced with a more suitable gate material, as in the example below. Either way, the shadow gap 120 ensures the gate operates as intended. Forming the gap 120 using such "in-situ" patterning in the SU epitaxy phase P3 (as described above) ensures that material does not need to be etched away too close to the delicate nanowires 11.

This is an example of the basic process where the superconductor is deposited as a uniform layer, but where a "shadow" from the selective area grown material is used to form a gap between the semiconductor and the superconductor. In this particular case, the superconductor, that does not touch the semiconductor, can be used as a side gate or etched away and replaced with a more suitable gate material, while the superconductor that are in direct contact with the semiconductor are used to induce superconductivity.

The bottom right of FIG. 5 shows both a side-view and a top-view of the substrate 10 at the end of the third phase P3. Note that, in the top-view, the part 8 of the superconductor layer 4 that partially coats the SE nanowire 11 is not distinguished from the uncoated part 118 of SE nanowires 11; rather the combined nanowire structure formed of the nanowires 11 and the portion of the superconductor material 8 that (partially) covers those nanowires (i.e. that is in direct contact therewith) is depicted as a single element, labelled SE//SU. This combined structure is similarly represented and labelled in later figures, and herein references to "SE/SU nanowires" or "SE//SU nanowires" refer to the SE nanowires 11 and the SU material 8 that (partially) covers the SE nanowires 11, unless otherwise indicated.

Figure 6:
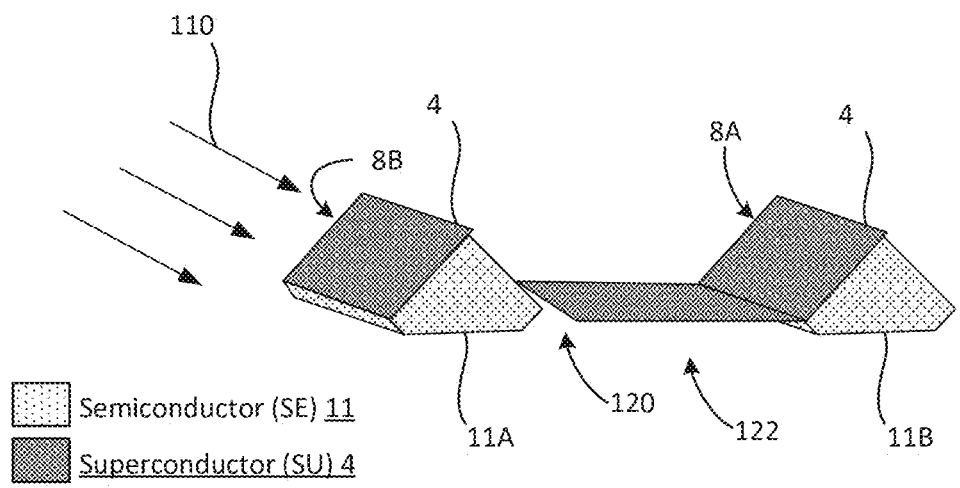
FIG. 6 shows a schematic perspective view of SAG SE nanowires in an epitaxial growth phase, in which superconducting material is deposited on and around the nanowires.

To further aid illustration, FIG. 6 shows a schematic perspective view of first and second nanowires 11A, 11B during the third phase P3, which are partially coated by respective parts 8A, 8B of the superconductor layer 4. A shadow gap 120 of the kind described above is shown, which is immediately adjacent the first nanowire 11A and separates the first nanowire 11A from a portion of the semiconductor layer 4 in a sidegate region 122, in the manner described above. The SAG phase P2 and superconductor growth phase P3 can be conducted in a vacuum chamber, preferably without moving the substrate 10 between phases. These phases can be carried out under high vacuum or ultra-high vacuum conditions ($\sim 10^{-8}$-$10^{-12}$ Torr or less), and those vacuum conditions may be maintained between phases. Among other things, this ensures a clean SE/SU interface, free from unwanted impurities.

As will be appreciated, both the SAG semiconductor growth of phase P2 and the superconductor growth of phase P3 require carefully calibrated conditions to get within respective "growth windows" for these two phases, and thereby achieve the desired semiconductor and superconductor growth respectively. Depending on the material type, the growth conditions, temperature and flux needs to be chosen carefully. For example, for MBE (which can be used in both the semiconductor SAG phase P2 and superconductor growth phase P3), the substrate generally needs to be heated to temperatures of around 500° C. or more to clean the surface for native oxide. However, in the SE SAG growth phase P2 and SU growth phase P3, the respective temperature windows in which the desired growth takes place is dependent on the composition of the SE material 11 and SU material 4 respectively. The superconductor is grown/deposited in-situ, without breaking vacuum. In this way the surface of SAG is not oxidized in air and remain clean until the SU is put on, which ensure a clean SE-SU interface.

Example Use-Cases

Using SAG as a basis for gatable superconductor network desirably involves an insulated substrate, and that the selective area grown material can carry induced superconductivity. The substrate 10 and oxide layer 12 on which the SE//SU nanowire network is grown can be incorporated in the end-product, such as a quantum circuit or quantum computer, along with the SE/SU nanowire network, without transferring the nanowires from the substrate on which they were originally fabricated.

Embodiments of the disclosed technology include topologically protected quantum computing circuits that comprise networks of nanowires formed using such mixed semiconductor and superconductor regions.

Figure 7:
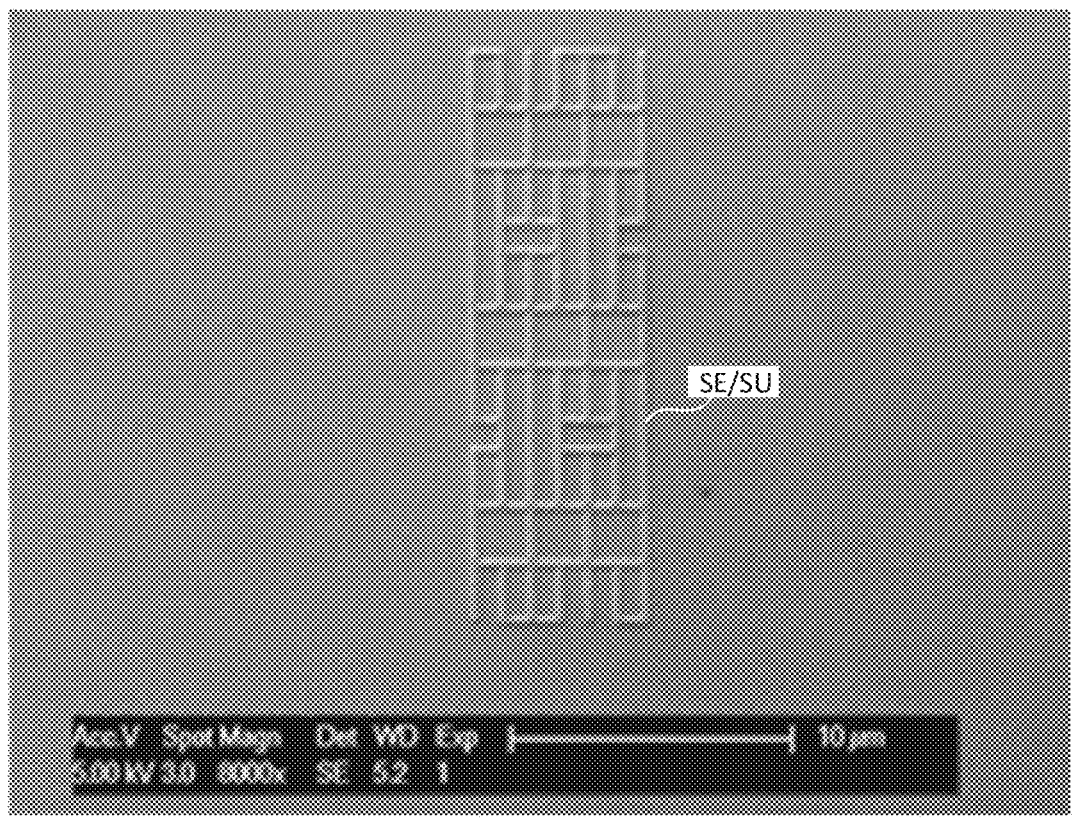
FIG. 7 shows a top view image of a SAG InAs nanowire network on an InP substrate.

In FIG. 7, for instance, a wire-pattern consisting of InAs nanowires grown on an insulating InP substrate is shown. In particular, FIG. 7 shows the fabrication of a complicated network based on one-dimensional nanowire network. The network is a SAG InAs nanowire network formed on an InP substrate.

Figure 8:
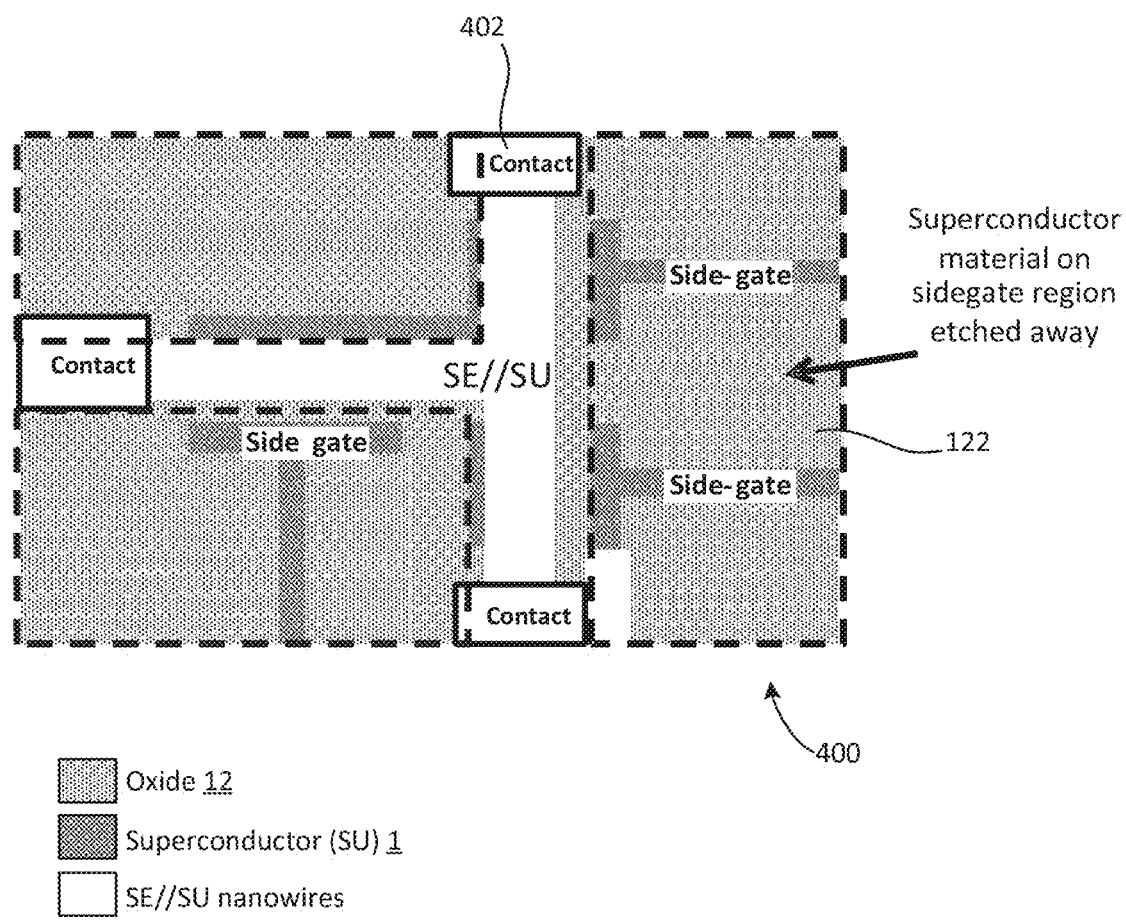
FIG. 8 shows a schematic top view of a quantum circuit comprising SE/SU nanowires and sidegate regions.

FIG. 8 shows a schematic top-view of a T-shaped SE//SU nanowire structure, which has been fabricated using the method described above, to form a quantum circuit 400. Contacts 402 of the quantum circuit 402 have been added to the SE//SU nanowires, to allow electrical connection therewith. Gating regions 4 are shown, in which most of the SU material 4 has been etched away, e.g. to be replaced with a different gating material (not shown), in order to form a side gate for manipulating the SE//SU nanowires, and—in the context of topological quantum computing, for example—for manipulating Majorana zero modes hosted by the SE//SU nanowires, in order to perform quantum computations.

Figure 9:
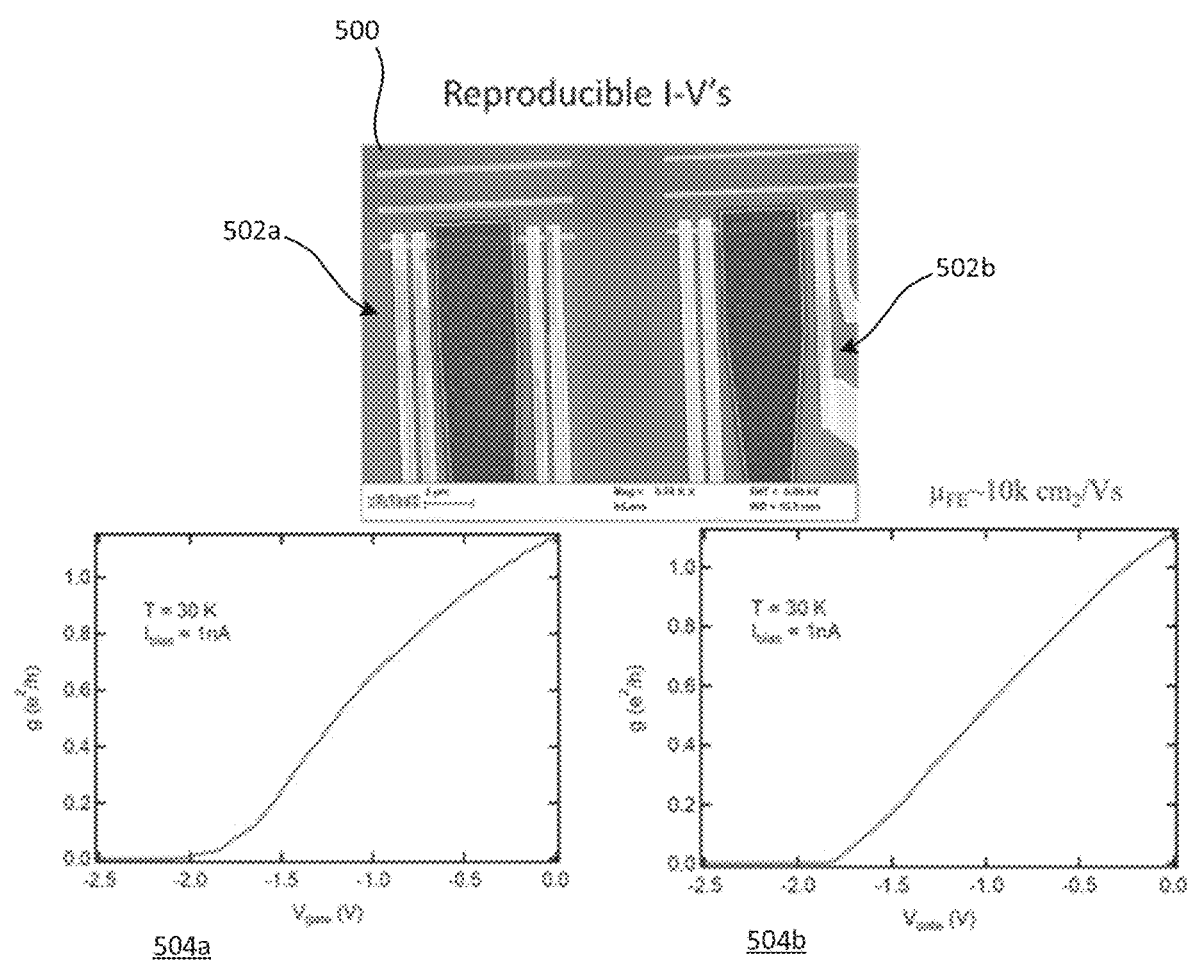
FIG. 9 shows respective I-V graphs as measured for two SAG nanowires fabricated using the described method.

FIG. 9 shows a top-view image 500 of two matching, side-by-side example SE/SU nanowire structures 502a, 502b, fabricated according to the described method. Here, contacts (bright vertical lines) and top-gates (dark vertical line) can be seen applied to SAG nanowires (bright horizontal lines). These can be added using lithography methods, for example. FIG. 9 also shows respective I-V (current-voltage) graphs 504a, 504b for the matching structures 502a, 502b respectively. As can be seen, the two SE/SU nanowire structures 502a, 502b exhibit very similar I-V characteristics. This demonstrates one of the benefits of the fabrication method, namely reproducibility, i.e. the ability to produce nanowire structures with consistent physical characteristics. This level of reproducibility represents a significant improvement with respect to existing nanowire fabrication methods.

Extension—In-Situ Patterning

Figure 10:
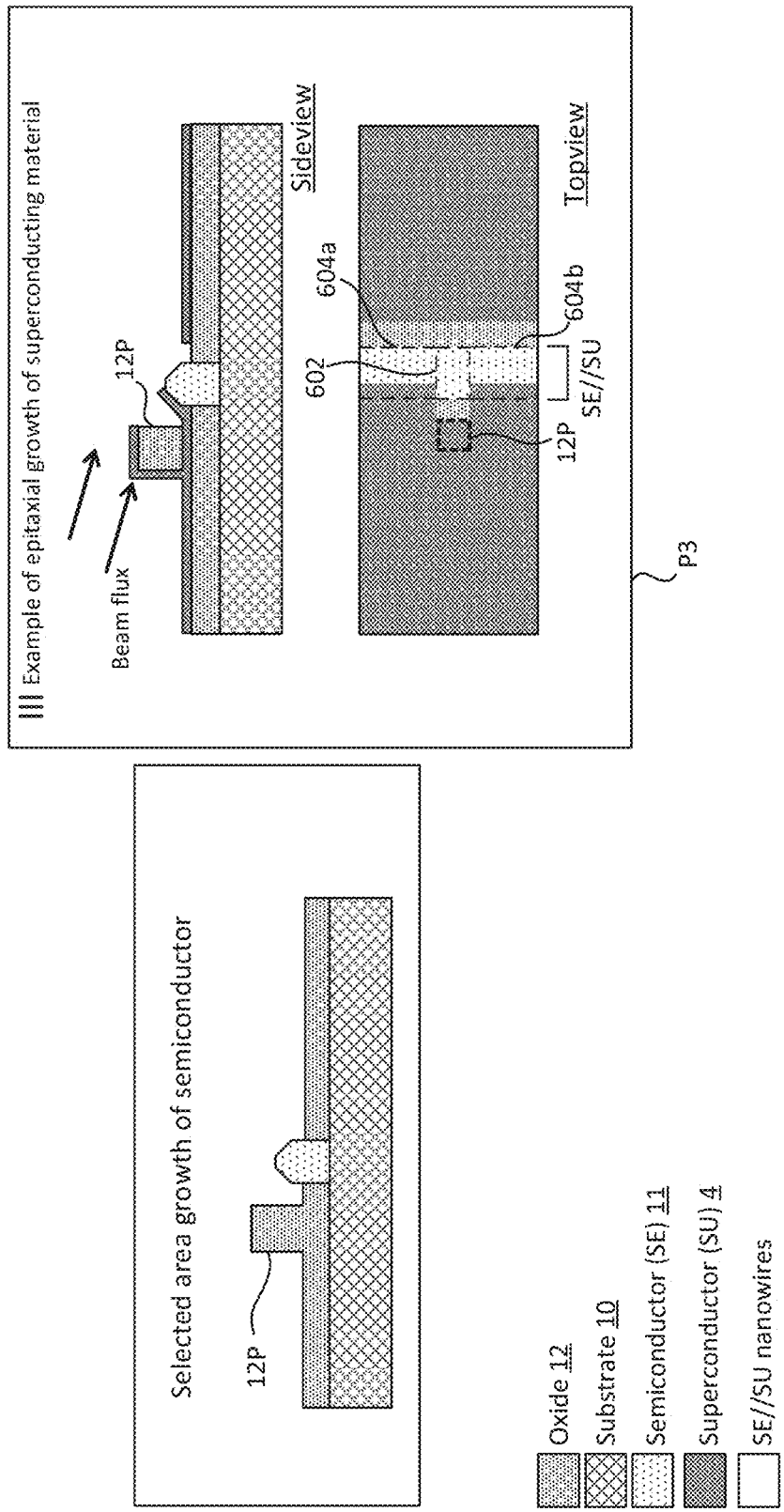
FIG. 10 schematically illustrates an extension of the fabrication method, in which in-situ patterning is used to create additional structure.
Figure 11:
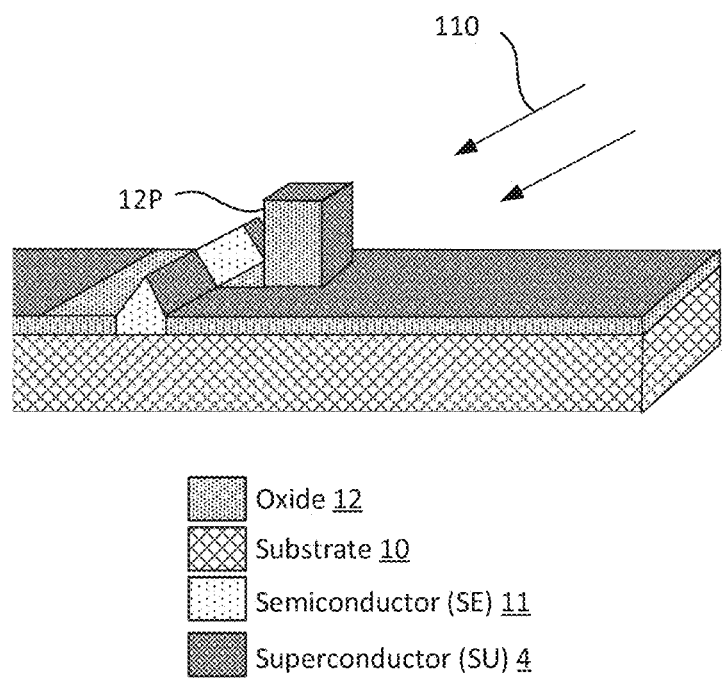
FIG. 11 shows a schematic perspective view to illustrate an example of in-situ patterning used to create a junction.

FIGS. 10 and 11 schematically illustrate one example of an extension of the method of FIG. 10, in which protruding dielectric structure 12P is used, in conjunction with an angled beam 110 in the superconductor growth phase P3, to perform in-situ patterning. The principle is similar to the in-situ patterning provided by the protruding SE material 11, in that the protruding dielectric structure 12P selectively obstructs the angles beam to prevent deposition of the SU material 4 from occurring in certain shadow regions of the kind described.

In this example, the protruding dielectric structure 12P is a "pillar" of dielectric material located adjacent a SE nanowire 11, so as to provide a shadow region 602 extending across the entire width of the nanowire 11, such that the nanowire 11 is entirely uncoated with SU material in this region 602 across its entire width. This uncoated portion 602 thus forms a SE junction between two sections 604a, 604b of SE/SU nanowire. This is shown in the side and top views of FIG. 10, and the perspective view of FIG. 11.

Figure 12:
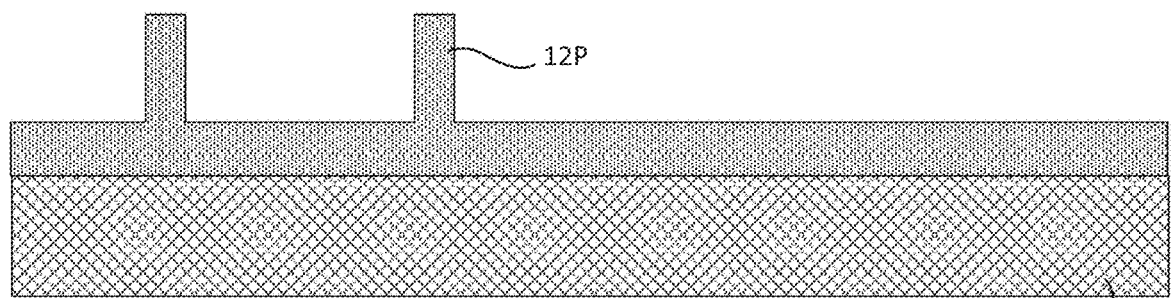
FIG. 12 shows a schematic side view of a substrate in another example of in-situ patterning.
Figure 12:
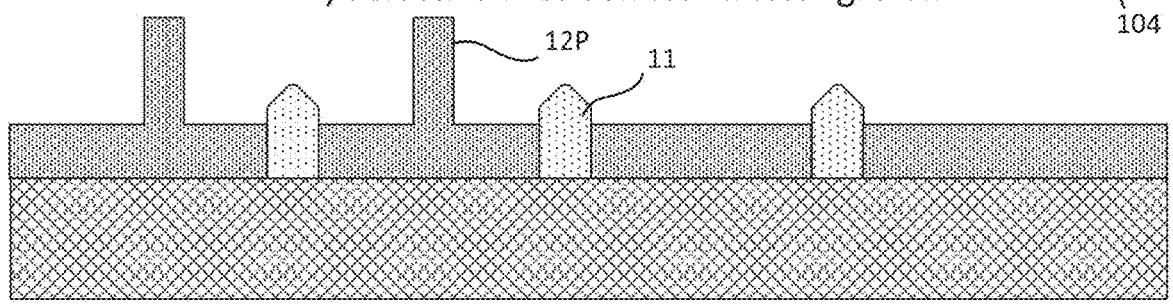
Figure 12:
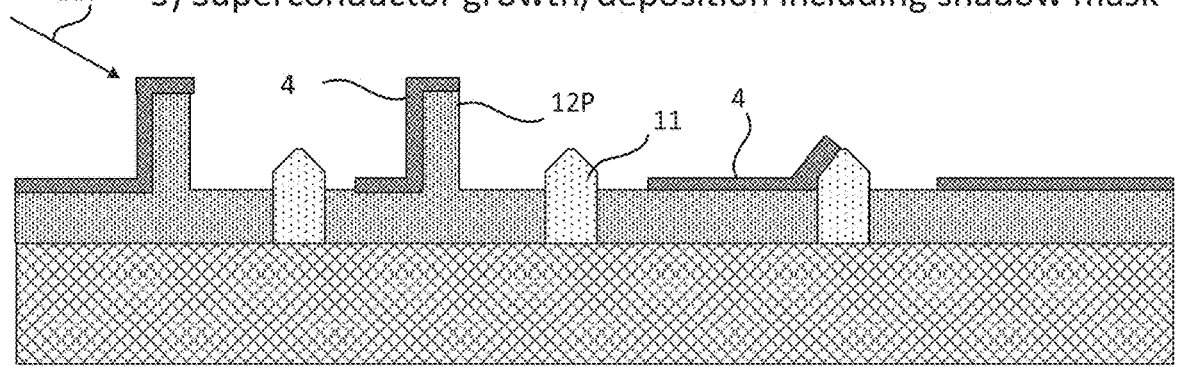
Figure 13:
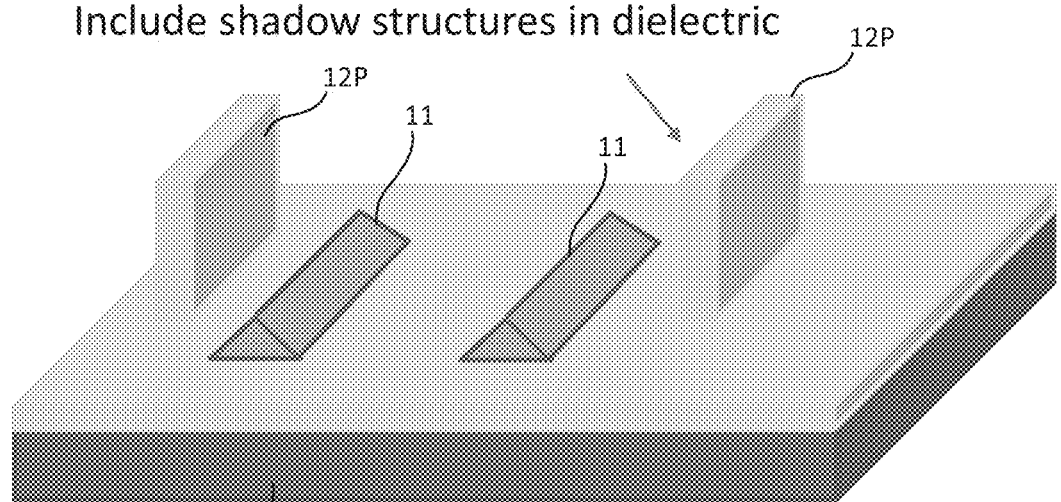
FIGS. 13 and 14 shows schematic perspective views of a substrate in yet another example of in-situ patterning.
Figure 14:
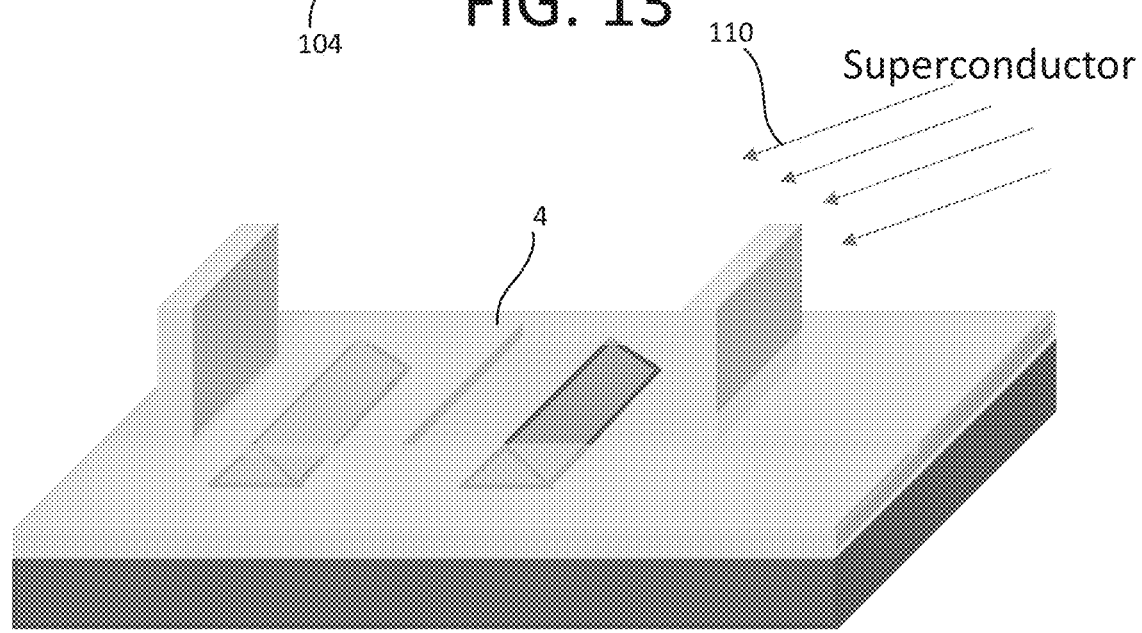

As illustrated in FIGS. 12-14, multiple protruding dielectric structures 12P can be used to achieve any desired in-situ patterning.

As will be appreciated, this is not limited to the formation of junctions, and protruding dielectric structures (e.g. walls, pillars, loops etc.) can be used, individually or in combination, to achieve any desired patterning of the SU material, according to the principles set out above.

Further Example Use-Cases

Figure 15:
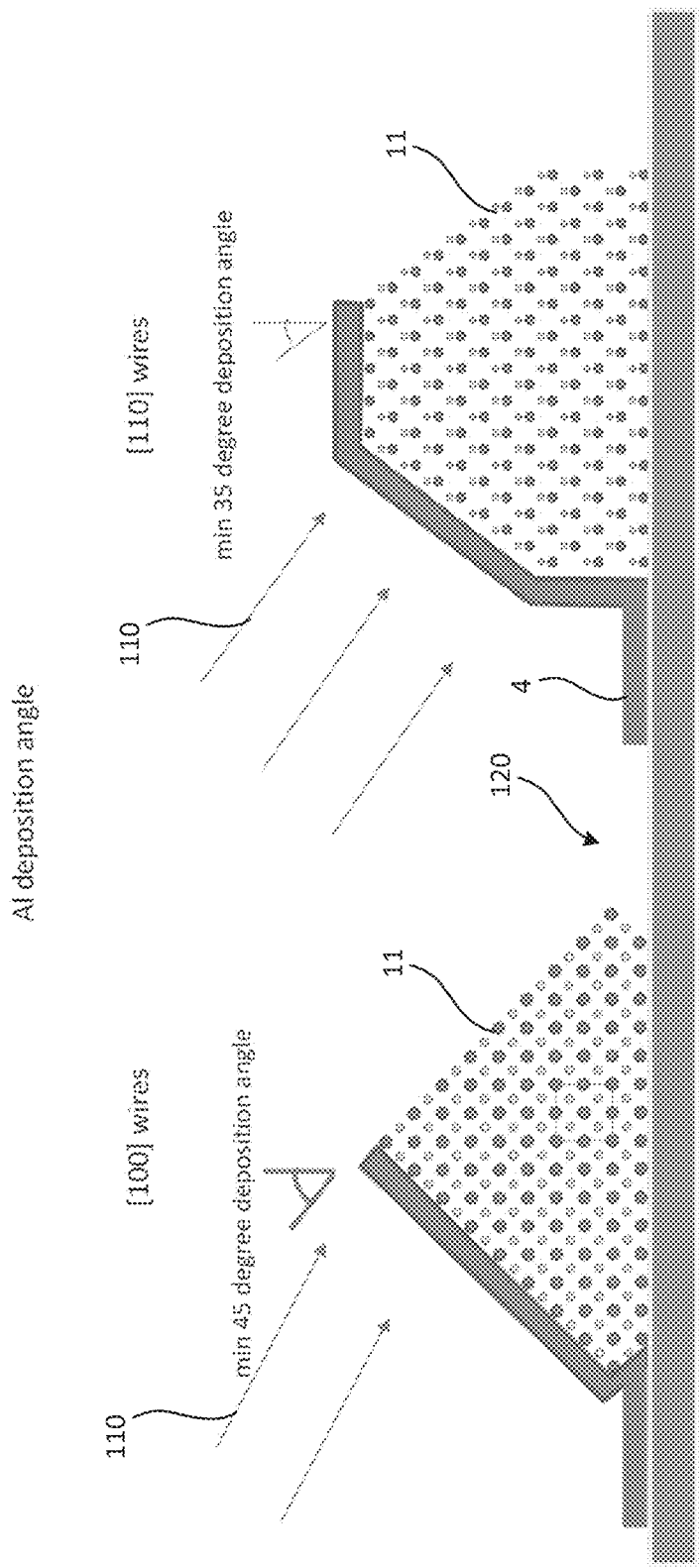
FIG. 15 shows a cross-section view of nanowires having different Miller indices.

FIG. 15 illustrates two crystalline nanowire structures that may be found in certain types of quantum circuit, namely a "[100]" SE/SU nanowire and a "[110]" SE/SU nanowire. Here, [100] and [110] are Miller indices, which in this context refer to the orientation of a nanowire's crystalline structure relative to the nanowire orientation itself. As can be seen, different miller indices result in the growth of different shaped nanowires in the SAG phase P2. In particular, an SAG [100] wire has an essentially triangular profile when a cross-section is taken across their width, whereas an SAG [110] wire has a flatter portion at its top. On account of the different profiles, in the epitaxial growth phase P3, the angle of the particle beam 110 is preferably selected in dependence on the miller index of the SAG nanowire(s). For [110] nanowires, an angle of at least 45 degrees relative to the z-axis may be suitable, whereas for [110] nanowires, an angle of at least 35 degrees may be appropriate.

Figure 16:
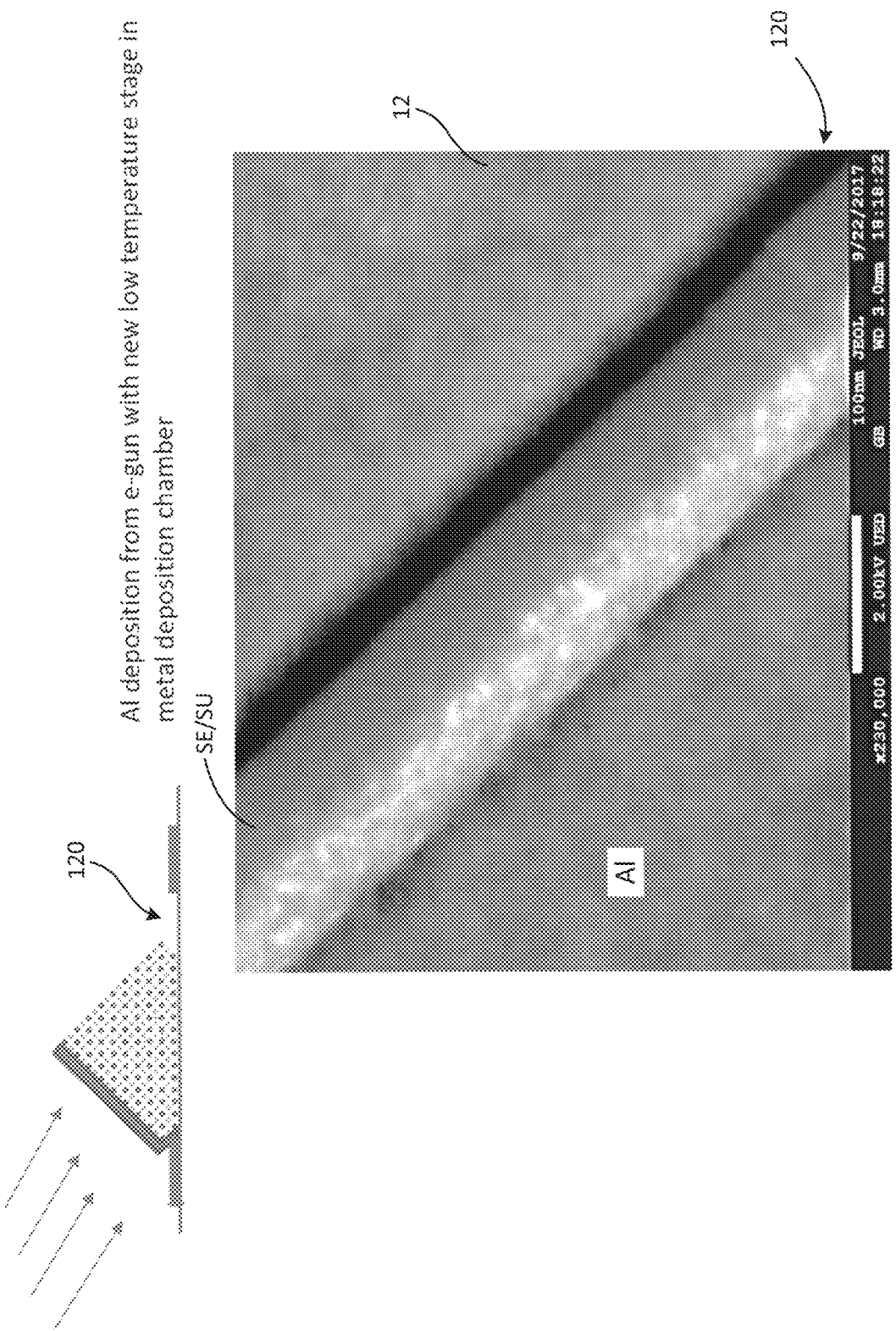
FIG. 16 shows an image of a [100] nanowire coated with superconductor at a first deposition angle.
Figure 17:
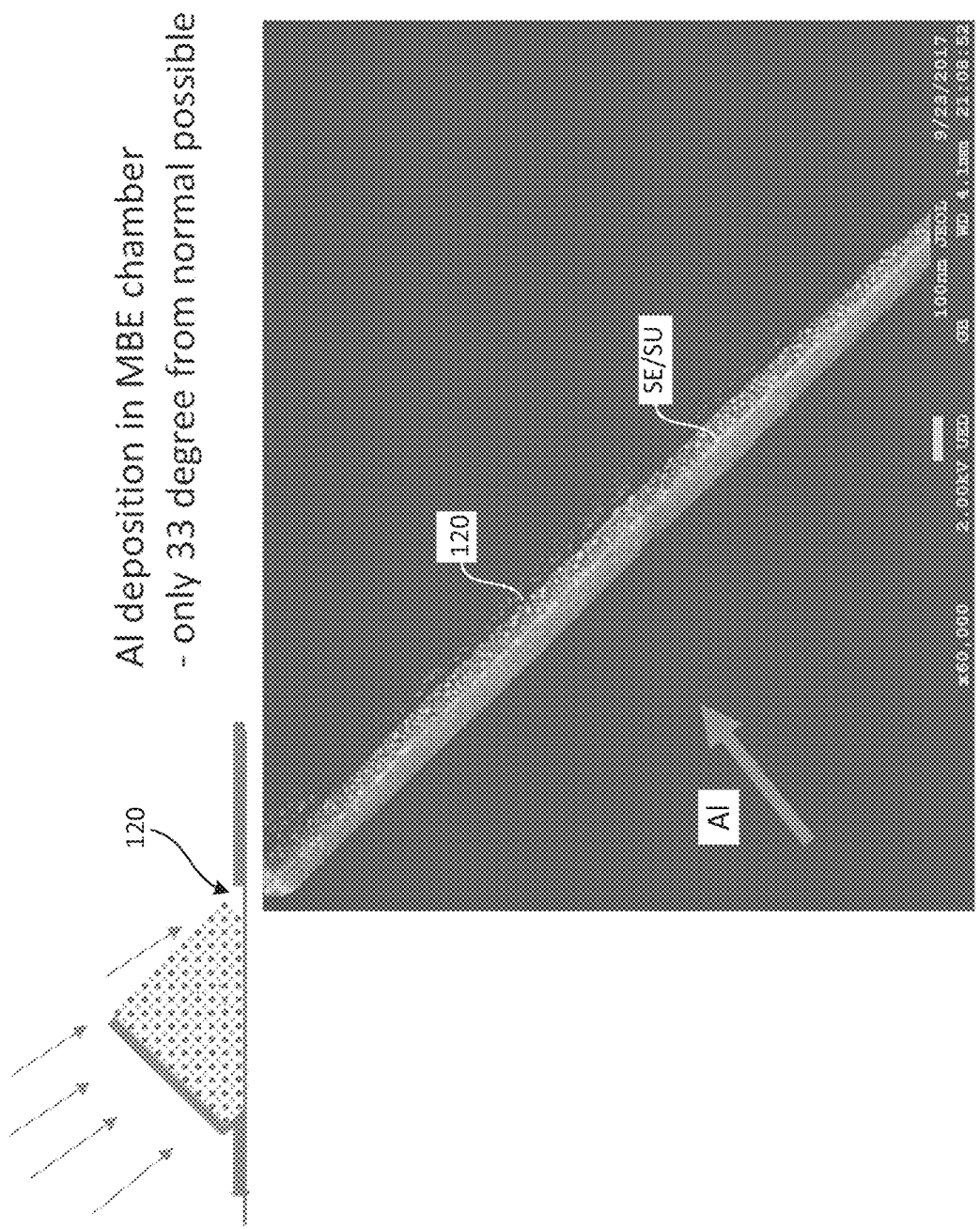
FIG. 17 shows an example of a [100] nanowire coated at a second deposition angle.
Figure 18:
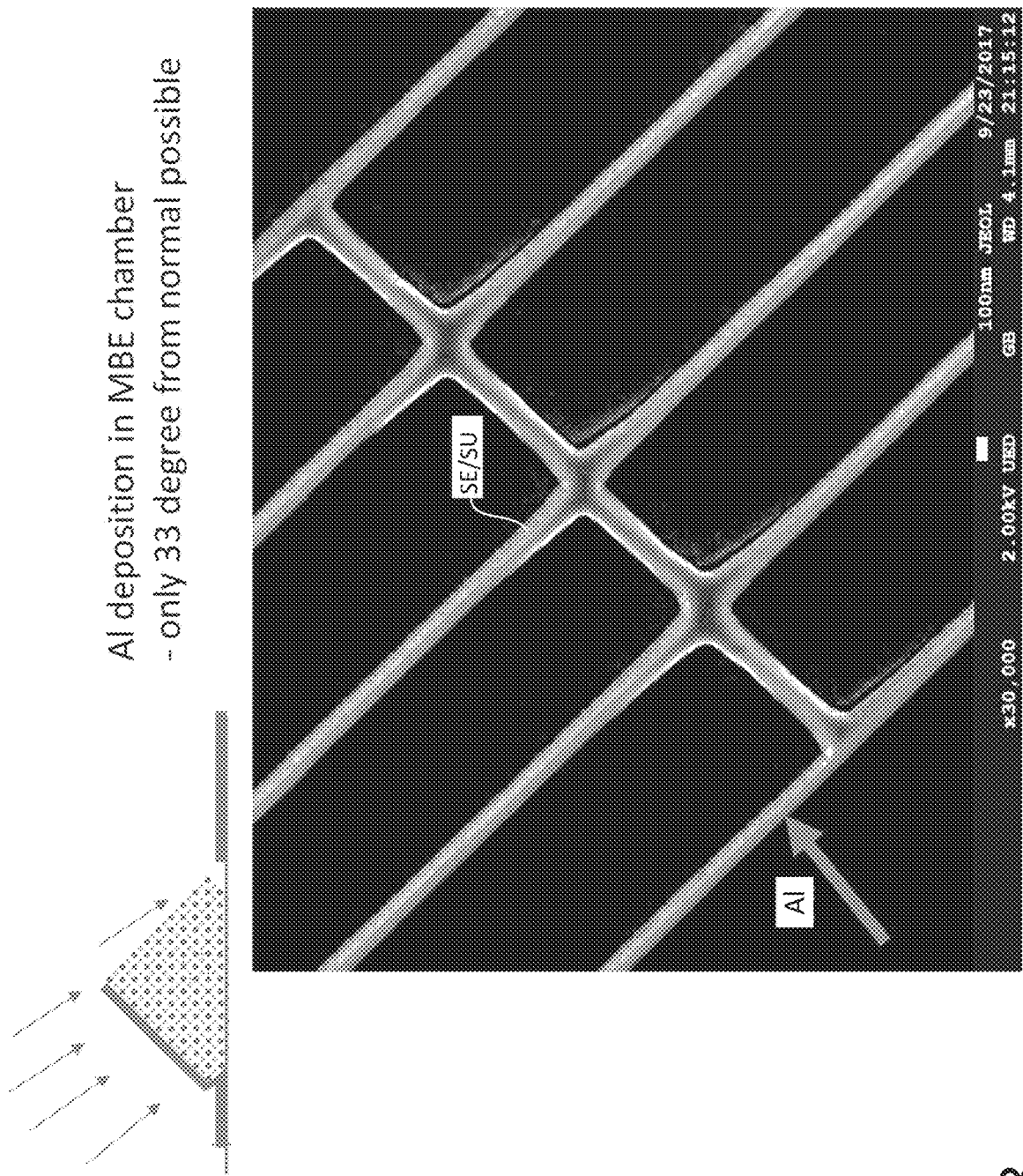
FIG. 18 shows a further image of [100] nanowires coated at the second disposition angle.

FIGS. 16 and FIGS. 17-18 show top-down images of fabricated SE//SU nanowires for different deposition angles—illustrated schematically at the top-left of each figure. As can be seen, different deposition angles can be used to achieve shadow gaps 120 of different widths.

Here, the shadow gap is created due to the SE nanowire 11 obstructing the angles beam, as described above, to separate the resulting SE/SU nanowire from a gating region 122.

The SE/SU nanowires of FIG. 14 were fabricated using A1 deposition from an electron-gun (e-gun) at a low temperature stage in a metal deposition chamber.

Figure 19:
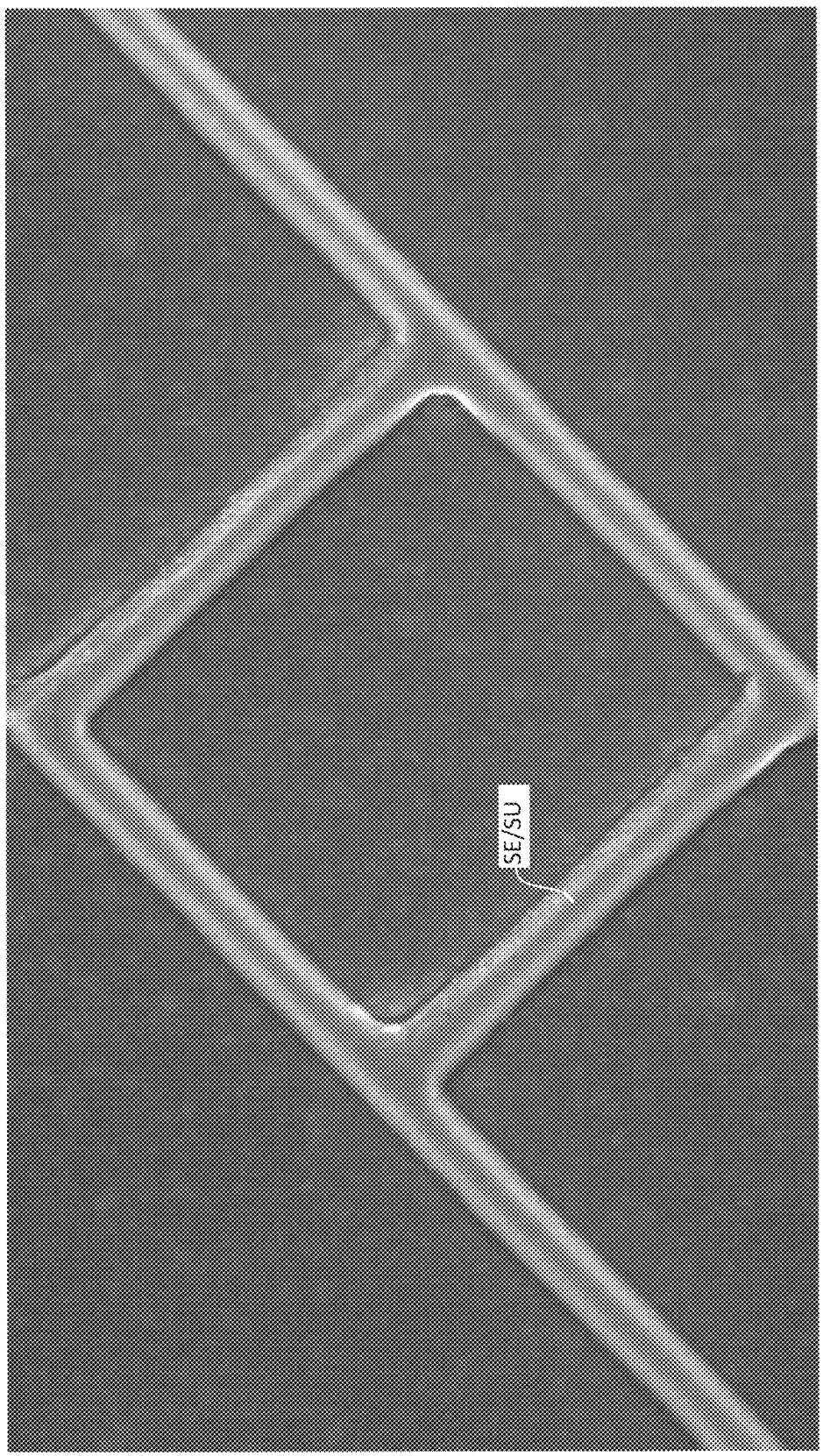
FIG. 19 shows a top view image of part of a SAG SE/SU nanowire network.

The SE/SU nanowires of FIGS. 17 and 18 were fabricated using MBE, in an MBE chamber, with a beam angle of only 33 degrees from normal (i.e. relative to the z-axis as defined above). This is purely an example and most systems allow the angle to be varied to the desired direction. FIG. 19 shows another image of an SE/SU nanowire structure fabricated using the described methods.

In general, the superconducting material can either deposited/grown uniformly on the whole substrate and subsequently removed in specified regions, or deposited/grown in specified regions using lithography masks during deposition/growth. This can be a form on in-situ patterning, as described above. In some example implementations, the selective-area-grown materials leave conducting in-plane oriented nanowires that can be tuned with a side gate, top gate, and/or a bottom gate. Further, in some example implementations, the substrate is insulated to prevent leakage currents.

Further aspects of the present disclosure, and example embodiments thereof, are set out below. A first aspect of the present disclosure provides a fabrication method comprising: forming at least one structure on the substrate which protrudes outwardly from a plane of the substrate; and using a beam to form a layer of material, at least part of which is in direct contact with a semiconductor structure on the substrate, the semiconductor structure comprising at least one nanowire, wherein the beam has a non-zero angle of incidence relative to the normal of the plane of the substrate such that the beam is incident on one side of the protruding structure, thereby preventing a portion of the nanowire in a shadow region adjacent the other side of the protruding structure in the plane of the substrate from being covered with the material.

In embodiments, the protruding structure may be adjacent the nanowire, with the shadow region extending across the width of the nanowire such that a section of the nanowire is not covered by the superconductor material across its entire width, thereby forming a junction between two further sections of the nanowire, both of which are at least partially covered by the superconductor material The protruding structure may be a dielectric structure. For example, the protruding dielectric structure may be formed of non-organic dialectic.

The at least one protruding structure may be formed by depositing material on the substrate and selectively etching away the material to form the at least one protruding structure.

Lithography may be used to form an etching pattern for etching the material.

The method may comprise forming a further layer of material using a beam at a different angle relative to the substrate, wherein said protruding structure or another protruding structure on the substrate prevents deposition of the further layer in a different shadow region.

The beam used to form the layer of material and the beam used to form the further layer of material may be incident on the substrate with different azimuthal angles about an axis normal to the plane of the substrate The beam used to form the layer of material and the beam used to form the further layer of material may be incident on the substrate at substantially the same angle of incidence relative to the axis normal to the plane of the substrate.

In a masking phase, a dielectric mask may be formed on the substrate, such that the dielectric mask leaves one or more regions of the substrate exposed; wherein, in a selective area growth phase, a semiconductor material may be selectively grown on the substrate in the one or more exposed regions to form the semiconductor structure on the substrate.

The at least one nanowire may be grown externally and transferred to the substrate.

The material may be a superconductor material.

A second aspect of the present disclosure provides a method of fabricating a pattern on a substrate, the method comprising: forming a patterning structure on the substrate, the patterning structure comprising one or more shadow walls extending outwardly from a plane in which a surface of the substrate substantially lies; in a first deposition phase, selectively depositing a first layer of material on the surface of the substrate using a first beam; and in a second deposition phase, selectively depositing a second layer of material on the surface of the substrate using a second beam; wherein the first and second beams have a non-zero angle of incidence relative to an axis normal to the surface of the substrate and different azimuthal angles about said axis, such that, in the first deposition phase, the first beam is incident on one side of a shadow wall of the patterning structure whereby the shadow wall prevents deposition in a first exposed shadow region adjacent the opposite side of the shadow wall in the plane of the substrate, and, in the second deposition phase, the second beam is incident on one side of the shadow wall or another shadow wall of the patterning structure whereby that shadow wall prevents deposition in a second exposed shadow region adjacent the opposite side of that shadow wall in the plane of the substrate.

The substrate may comprise a device on which material is selectively deposited in the first and second deposition phases, and the device may be located such that no deposition occurs on a first portion of the device in the first exposed shadow region in the first deposition phase, and no deposition occurs on a second portion of the device in the second exposed shadow region in the second deposition phase.

The device may be semiconductor device.

The device may be a nanoscale device.

A third aspect of the present disclosure provides a fabrication method comprising: forming at least one structure on the substrate which protrudes outwardly from a plane in which a surface of the substrate substantially lies; transferring to the surface of the substrate at least one device to be patterned; and using a beam to selectively deposit a layer of material on the device once transferred to the surface of the substrate, wherein the beam has a non-zero angle of incidence relative to the normal of the plane of the substrate such that the beam is incident on one side of the protruding structure, thereby preventing a portion of device in a shadow region adjacent the other side of the protruding structure in the plane of the substrate from being covered with the material.

The device may comprise at least one nanowire.

The nanowire transferred to the surface of the substrate may be created using a vapour-liquid-solid (VLS) method.

The selectively deposited material may be a superconductor.

One further aspect of the present technology is directed to a method of fabricating a mixed semiconductor-superconductor platform, the method comprising the following steps. In a masking phase, a dielectric mask is formed on a substrate, such that the dielectric mask leaves one or more regions of the substrate exposed. In a selective area growth phase, a semiconductor material is selectively grown on the substrate in the one or more exposed regions. In a superconductor growth phase, a layer of superconducting material is formed, at least part of which is in direct contact with the selectively grown semiconductor material. The mixed semiconductor-superconductor platform comprises the selectively grown semiconductor material and the superconducting material in direct contact with the selectively grown semiconductor material.

In embodiments, the semiconductor material in the one or more exposed regions may form a network of in-plane nanowires.

The layer of superconducting material may be epitaxially grown in the superconductor growth phase.

The superconducting material may be epitaxially grown using molecular beam epitaxy (MBE).

The layer of superconducting material may be formed, in the superconductor growth phase, using a beam.

The beam may have a non-zero angle of incidence relative to the normal of a plane of the substrate.

The particle beam may be angled relative to the substrate, such that the beam is incident on one side of a structure protruding outwardly of the plane of the substrate, thereby preventing a shadow region on the other side of the protruding structure from being covered with the superconductor material.

The protruding structure may be a protruding portion of the semiconductor material, such that the shadow region separates the semiconductor material from a portion of the superconductor material deposited in a gating region.

The method may comprise: removing semiconductor material from the gating region; and forming a gate, from a gating material, in the gating region.

The protruding structure may be formed of dielectric material.

The protruding structure may be adjacent a nanowire formed by the semiconductor material, the shadow region extending across the width of the nanowire such that a section of the nanowire is not covered by the superconductor material across its entire width, thereby forming a junction between two further sections of the nanowire, both of which are at least partially covered by the superconductor material.

The selective area growth phase and the superconductor growth phase may be performed in a vacuum chamber, with the substrate remaining in the vacuum chamber throughout and in between those phases.

Another aspect of the present technology provides a quantum circuit, comprising: a selective area grown (SAG) semiconductive region; and a superconducting region.

In embodiments, the SAG semiconductive region may comprise conducting in-plane nanowires.

The in-plane nanowires may be tunable. The in-plane nanowires may be tunable via a side gate, top gate, or bottom gate.

The superconducting region may comprise superconductor material in direct contact with semiconductor material of the SAG semiconductive region.

The quantum circuit may comprise an insulating substrate on which the SAG semiconductive region was grown and a dielectric mask formed on the insulating substrate, the superconducting region formed of superconductor material selectively grown on one or more regions of the substrate that are not covered by the dielectric mask.

Another aspect of the present technology provides a topological quantum computer comprising: a network of selective area grown (SAG) nanowires; and a layer of superconductor material formed on the SAG nanowires. The network of SAG nanowires and the superconductor material are coupled so as to provide Majorana modes for use in performing quantum computations.

In embodiments, the topological quantum computer may comprise at least one gate arranged for manipulating the Majorana modes.

Another aspect of the technology provides a method, comprising: generating a mixed semiconductor-superconductor platform for performing quantum computing. The generating comprises: depositing a superconductor layer on a substrate; removing one or more regions of the deposited superconductor region; and growing one or more selective area grown semiconductive regions in the removed regions of the deposited superconductor regions.

In embodiments, the growing the one or more selective area grown semiconductive regions comprises forming nanowires that can be tuned with a side gate, top gate, and/or a bottom gate. Another aspect of the technology provides a method, comprising: generating a mixed semiconductor-superconductor platform for performing quantum computing, wherein the generating comprises: growing one or more superconductor layers on a substrate; growing one or more selective area grown semiconductive regions on the substrate in regions of the substrate unoccupied by the one or more superconductor layers.

In embodiments, the growing the one or more selective area grown semiconductive regions comprises forming nanowires that can be tuned with a side gate, top gate, and/or a bottom gate.

Another aspect of this disclosure provides a method of fabricating a mixed semiconductor-superconductor platform, the method comprising: forming a semiconductor structure on a substrate; forming at least one protruding dielectric structure; and using a beam to form a layer of superconducting material, at least part of which is in direct contact with the semiconductor structure, wherein the beam is angled relative to the protruding dielectric structure such that the beam is incident on one side of the protruding dielectric structure, thereby preventing a shadow region on the other side of the protruding dielectric structure from being covered with the superconductor material.

The disclosed methods, apparatus, and systems should not be construed as limiting in any way. The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method of fabricating a pattern on a substrate, the method comprising:
   forming a patterning structure on the substrate, the patterning structure comprising one or more shadow walls extending outwardly from a plane in which a surface of the substrate substantially lies;
   in a first deposition phase, selectively depositing a first layer of material on the surface of the substrate using a first beam; and
   in a second deposition phase, selectively depositing a second layer of material on the surface of the substrate using a second beam,
   wherein the first and second beams have a non-zero angle of incidence relative to an axis normal to the surface of the substrate and different azimuthal angles about said axis, such that, in the first deposition phase, the first beam is incident on one side of a shadow wall of the patterning structure whereby the shadow wall prevents deposition in a first exposed shadow region adjacent the opposite side of the shadow wall in the plane of the substrate, and, in the second deposition phase, the second beam is incident on one side of the shadow wall or another shadow wall of the patterning structure whereby that shadow wall prevents deposition in a second exposed shadow region adjacent the opposite side of that shadow wall in the plane of the substrate, and further wherein the substrate comprises a device on which material is selectively deposited in the first and second deposition phases, the device being located such that no deposition occurs on a first portion of the device in the first exposed shadow region in the first deposition phase, and no deposition occurs on a second portion of the device in the second exposed shadow region in the second deposition phase.

2. The method of claim 1, wherein the device is semiconductor device.

3. The method of claim 1, wherein the device is a nanoscale device.

4. The method of claim 1, further comprising forming a semiconductor structure on the substrate, wherein the first layer of material and the second layer of material are deposited on the semiconductor structure.

5. The method of claim 1, wherein the first and second layers of material are a superconductor.

6. The method of claim 1, wherein the first beam and the second beam are electron beams.

7. The method of claim 1, wherein the first beam and the second beam are molecular beams.

8. A fabrication method comprising:
forming at least one structure on a substrate which protrudes outwardly from a plane in which a surface of the substrate substantially lies;
transferring to the surface of the substrate at least one device to be patterned; and
using a beam to selectively deposit a layer of material on the device once transferred to the surface of the substrate, wherein the beam has a non-zero angle of incidence relative to the normal of the plane of the substrate such that the beam is incident on one side of the protruding structure, thereby preventing a portion of device in a shadow region adjacent the other side of the protruding structure in the plane of the substrate from being covered with the material.

9. The method of claim 8, wherein the device comprises at least one nanowire.

10. The method of claim 9, wherein the nanowire to be transferred to the surface of the substrate is created using a vapour-liquid-solid (VLS) method.

11. The method of claim 9, wherein the selectively deposited material is a superconductor.

12. The method of claim 8, wherein the protruding structure is a semiconductor structure.

13. The method of claim 8, wherein the protruding structure is a InAs or a two-dimensional electron gas structure.

14. The method of claim 8, wherein the protruding structure includes a first semiconductor structure and a second semiconductor structure having different crystalline orientations.

15. The method of claim 14, wherein the selectively deposited layer is a superconductor layer.

16. The method of claim 15, wherein the selectively deposited layer and the first semiconductor structure and the second semiconductor structure form first and second nanowires.

17. The method of claim 16, wherein the different crystalline orientations are associated with a [001] Miller index and a [110] Miller index.

18. The method of claim 8, wherein the beam is an electron beam.

19. The method of claim 8, wherein the beam is a molecular beam.

* * * * *